(12) United States Patent
Chen et al.

(10) Patent No.: US 12,283,570 B2
(45) Date of Patent: Apr. 22, 2025

(54) PACKAGE STRUCTURE

(71) Applicant: Taiwan Semiconductor Manufacturing Company, Ltd., Hsinchu (TW)

(72) Inventors: Ming-Fa Chen, Taichung (TW); Hsien-Wei Chen, Hsinchu (TW); Sung-Feng Yeh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/305,370

(22) Filed: Apr. 23, 2023

(65) Prior Publication Data

US 2023/0307417 A1   Sep. 28, 2023

Related U.S. Application Data

(63) Continuation of application No. 17/199,443, filed on Mar. 12, 2021, now Pat. No. 11,676,942.

(51) Int. Cl.
| | |
|---|---|
| H01L 25/065 | (2023.01) |
| H01L 21/66 | (2006.01) |
| H01L 23/00 | (2006.01) |
| H01L 23/31 | (2006.01) |
| H01L 25/00 | (2006.01) |

(52) U.S. Cl.
CPC ......... *H01L 25/0655* (2013.01); *H01L 22/14* (2013.01); *H01L 23/3128* (2013.01); *H01L 24/24* (2013.01); *H01L 25/50* (2013.01); *H01L 2224/24225* (2013.01)

(58) Field of Classification Search
None
See application file for complete search history.

(56) References Cited

U.S. PATENT DOCUMENTS

| | | | | |
|---|---|---|---|---|
| 9,735,131 | B2 * | 8/2017 | Su | H01L 25/50 |
| 10,879,224 | B2 * | 12/2020 | Chen | H01L 24/73 |
| 10,886,245 | B2 * | 1/2021 | Chen | H01L 24/05 |
| 2017/0053844 | A1 * | 2/2017 | Tsai | H01L 25/0655 |
| 2019/0131277 | A1 * | 5/2019 | Yang | H01L 24/05 |
| 2019/0393153 | A1 * | 12/2019 | Wang | H01L 21/76898 |
| 2020/0105635 | A1 * | 4/2020 | Yu | H01L 23/3677 |
| 2020/0135708 | A1 * | 4/2020 | Chen | H01L 23/5389 |
| 2020/0273840 | A1 * | 8/2020 | Elsherbini | H01L 24/17 |

(Continued)

*Primary Examiner* — Telly D Green
(74) *Attorney, Agent, or Firm* — JCIPRNET

(57) ABSTRACT

A semiconductor structure includes a first die, a dielectric layer, a second interconnection structure, a second conductive pad and a conductive feature. The first die includes a first interconnection structure over a first substrate and a first conductive pad disposed on and electrically connected to the first interconnection structure. The first conductive pad has a probe mark on a surface thereof. The dielectric layer laterally warps around the first die. The second interconnection structure is disposed on the first die and the dielectric layer, the second interconnection structure includes a conductive via landing on the first conductive pad of the first die, and the conductive via is spaced apart from the first probe mark. The second conductive pad is disposed on and electrically connected to the second interconnection structure. The conductive feature is disposed on the second conductive pad.

20 Claims, 18 Drawing Sheets

(56) References Cited

U.S. PATENT DOCUMENTS

| | | | |
|---|---|---|---|
| 2020/0294921 A1* | 9/2020 | Liu | H01L 25/50 |
| 2020/0381379 A1* | 12/2020 | Chen | H01L 23/544 |
| 2020/0395313 A1* | 12/2020 | Mallik | H01L 21/486 |
| 2021/0005542 A1* | 1/2021 | Mallik | H01L 25/18 |
| 2021/0057303 A1* | 2/2021 | Chen | H01L 21/486 |
| 2021/0280523 A1* | 9/2021 | We | H01L 21/4853 |

\* cited by examiner

PACKAGE STRUCTURE

CROSS-REFERENCE TO RELATED APPLICATION

This application is a continuation application of and claims the priority benefit of U.S. application Ser. No. 17/199,443, filed on Mar. 12, 2021, now allowed. The entirety of the above-mentioned patent applications is hereby incorporated by reference herein and made a part of this specification.

BACKGROUND

The packages of integrated circuits are becoming increasing complex, with more device dies packaged in the same package to achieve more functions. For example, System on Integrate Chip (SoIC) has been developed to include a plurality of device dies such as processors and memory cubes in the same package. The SoIC can include device dies formed using different technologies and have different functions, thus forming a system. This may save manufacturing cost and optimize device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
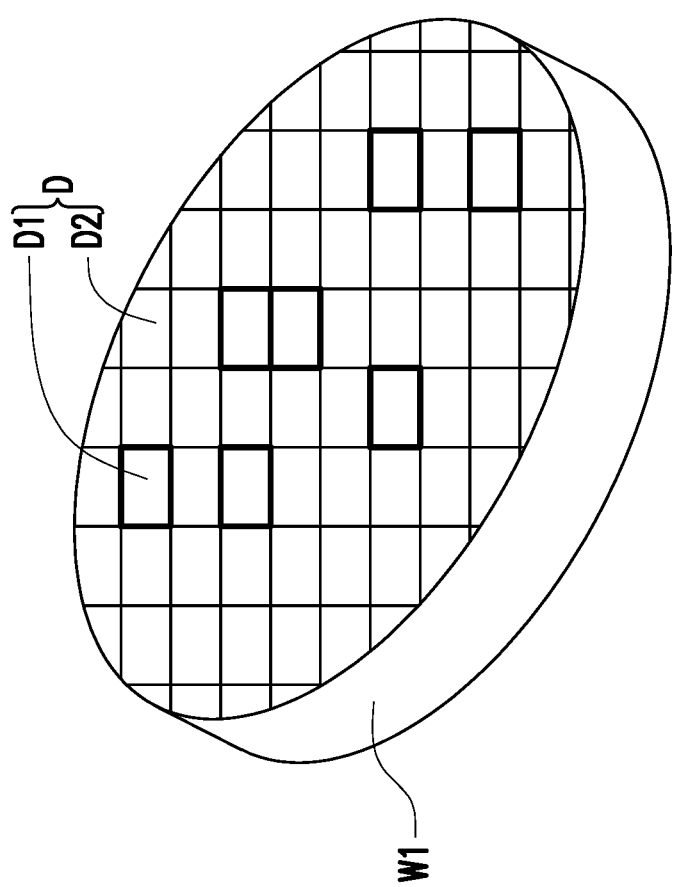
FIG. 1A to FIG. 1K are schematic cross-sectional views illustrating a method of manufacturing a semiconductor structure according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1K are schematic cross-sectional views illustrating a method of forming a package structure according to some embodiments of the disclosure.

Referring to FIG. 1A, a wafer W1 is provided. In some embodiments, the wafer W1 is a semiconductor wafer including a plurality of dies D. The dies D may be arranged as an array and spaced from each other through scribe regions therebetween. Among the plurality of dies D, some dies (such as the dies D1) may be good dies, while some other dies, such as the dies D2 may be bad dies (or referred to as "fail dies"). In some embodiments, the wafer W1 is a low yield wafer, in which the proportion of good dies D1 (i.e. the ratio of the number of good dies D1 to the total number of dies D of the wafer W1) may be 0.3 or less, such as 0.1 or less. As an example, the wafer W1 includes 100 dies D, and number of good dies D1 is 10 or less. In alternative embodiments, the wafer W1 is a high yield wafer, in which the proportion of good dies D1 may be 0.8 or more, such as 0.9 or more. It is noted that, the number of dies D included in the wafer W1 shown in FIG. 1A is merely for illustration, and the disclosure is not limited thereto.

In some embodiments, a testing process is performed on the wafer W1 to test each of the dies D, so as to identify whether the tested die is a good die or bad die. In some embodiments, the testing process is also referred to as a "wafer acceptance testing (WAT)". Probes may be used to electrically couple to a conductive pad of the die D for testing. In some embodiments, the testing process may be selected to test different properties of the die, such as leakage current, breakdown voltage, threshold voltage and effective channel length, saturation current, contact resistance or connections thereof. After the testing process is performed, the dies D1 are identified as good dies, which may be referred to as "known good dies (KGD)". Thereafter, a singulation process (e.g. die saw process) is performed to singulate the dies D from the wafer W1, and the good dies D1 are selected for further processes.

Figure 1B:
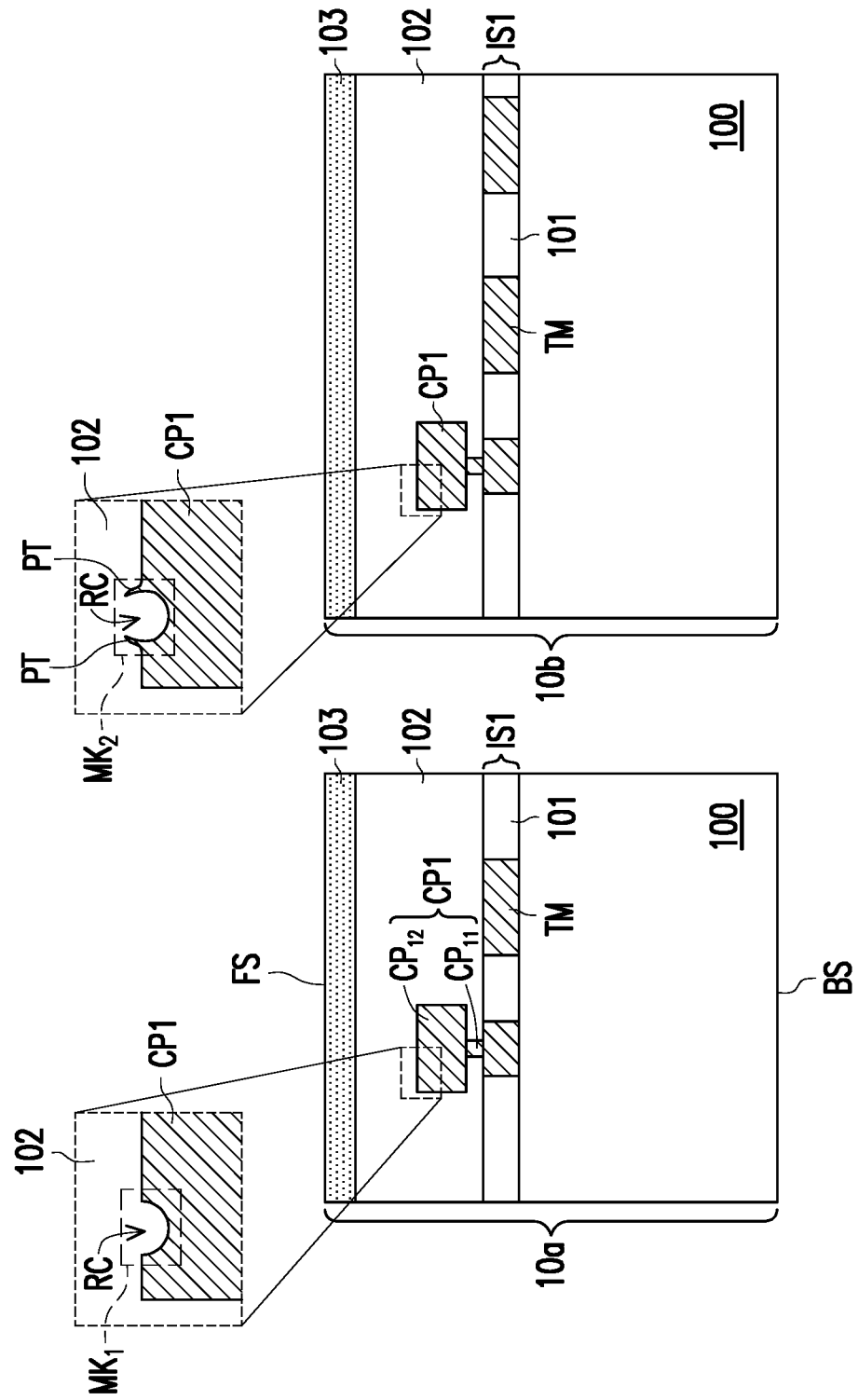

Referring to FIG. 1B, a plurality of dies 10a and 10b are provided. The dies 10a and 10b may be known good dies singulated from one or more wafers. For example, one or both of the dies 10a and 10b may be selected from the good dies D1 singulated from the wafer W1 (FIG. 1A). In other words, the dies 10a and 10b have been subjected to a testing process. In some embodiments, the dies 10a and 10b may be selected from a same wafer or different wafers. The sizes and types of the dies 10a and 10b may be the same or different.

In some embodiments, the dies 10a and 10b are different types of dies and perform different functions.

The dies 10a and 10b may respectively be an application-specific integrated circuit (ASIC) chip, an System on Chip (SoC), an analog chip, a sensor chip, a wireless and radio frequency chip, a voltage regulator chip, a logic die such as a Central Processing Unit (CPU) die, a Micro Control Unit (MCU) die, a BaseBand (BB) die, an Application processor (AP) die, or a memory chip such as a Dynamic Random Access Memory (DRAM) die or a Static Random Access Memory (SRAM) die, or the like, or other types of die, for example.

In some embodiments, the dies 10a and 10b have similar structures. For example, the die 10a/10b may include a substrate 100, a plurality of devices, an interconnection structure IS1, one or more conductive pads CP1, and a passivation layer 102. In some embodiments, the substrate 100 is a semiconductor substrate made of silicon and/or other semiconductor materials. Alternatively or additionally, the substrate 100 includes other elementary semiconductor materials such as germanium, gallium arsenic, or other suitable semiconductor materials. In some embodiments, the substrate 100 may further include other features such as various doped regions, buried layer(s), and/or epitaxy layer(s). Moreover, in some embodiments, the substrate 100 is made of an alloy semiconductor such as silicon germanium, silicon germanium carbide, gallium arsenic phosphide, or gallium indium phosphide. Furthermore, the substrate 100 may be a semiconductor on insulator such as silicon on insulator (SOI) or silicon on sapphire.

In some embodiments, a plurality of devices (not shown) are formed in and/or on the substrate 100. The devices may include active devices, passive devices, or combinations thereof. For example, the devices may include transistors, capacitors, resistors, diodes, photodiodes, fuse devices, or the like, or combinations thereof.

The interconnection structure IS1 is formed on the substrate 100 to electrically connect the various devices in and/or on the substrate 100 to form a functional circuit. The interconnection structure IS1 may include a plurality of conductive features embedded in a dielectric structure. The dielectric structure may include a plurality of dielectric layers, such as inter-layer dielectric layers (ILDs) and inter-metal dielectric layers (IMDs). In some embodiments, the dielectric structure is an inorganic dielectric structure. The material of the dielectric structure may include silicon oxide, silicon nitride, silicon oxynitride, silicon carbide, low-K dielectric material, such as un-doped silicate glass (USG), phosphosilicate glass (PSG), boron-doped phosphosilicate glass (BPSG), fluorinated silica glass (FSG), $SiO_xC_y$, Spin-On-Glass, combinations thereof, or the like.

The conductive features may be interconnected to each other and embedded in the dielectric structure. The conductive features may include multi-layers of conductive lines, conductive vias, and conductive contacts. The conductive contacts may be formed in the ILDs to electrically connect the conductive lines to the devices; the conductive vias may be formed in the IMDs to electrically connect the conductive lines in different layers. The conductive features may include metal, metal alloy or a combination thereof. For example, the conductive features may include tungsten (W), copper (Cu), copper alloys, aluminum (Al), aluminum alloys, or combinations thereof.

For the sake of brevity, a top conductive feature TM and a dielectric layer 101 laterally aside the top conductive feature TM of the interconnection structure IS1 are shown in FIG. 1B to represent the interconnection structure IS1. It is understood that, the interconnection structure IS1 further includes multi-layers of conductive features and dielectric layers (as described above) disposed between the top conductive feature TM and the substrate 100. In some embodiments, the top conductive feature TM is the topmost conductive feature of the interconnection structure IS1, and the top surface of the top conductive feature TM may be substantially coplanar with the top surface of the dielectric layer 101.

The conductive pad CP1 is disposed on and electrically connected to the top conductive feature TM. The conductive pad CP1 includes metal or metal alloy, such as aluminum, copper, nickel, or alloys thereof. In an embodiment, the conductive pad CP1 is an aluminum pad. In some embodiments, the conductive pad CP1 includes a via portion CP11 landing on the top conductive feature TM, and a pad portion CP12 on the via portion CP11. Although one conductive pad CP1 is illustrated in the figures, the dies 10a and 10b may respectively include a plurality of conductive pads CP1, and the number of the pads CP1 included in respective die is not limited in the disclosure.

In some embodiments, during the above described testing process, a probe (not shown) may be used to electrically couple/connect to at least one of the conductive pads CP1. The probe physically contacts and may insert into the target conductive pad CP1 in order to electrically couple to the conductive pad CP1. In some embodiments, after the testing process using a probe is performed, the probe is removed from the conductive pad CP, and a probe mark may be formed in an upper portion of the conductive pad CP1. The probe mark may include an unflat region in the surface of the conductive pad CP1. The probe mark may include dent(s), recess(es), protrusion(s) or combinations thereof. In some embodiments, as shown in the enlarger view, the conductive pad CP1 of the die 10a may have a probe mark MK1 including a dent or a recess RC, and the conductive pad CP1 of the die 10b may have a probe mark MK2 including a recess RC and protrusions PT adjacent to the recess RC. The recess RC has a surface lower than the top surface of the conductive pad CP1, and the protrusions PT are protruding from the top surface of the conductive pad CP. The protrusions PT may have the same or different heights. It is noted that, the sizes and shapes of the probe masks shown in the figures are merely for illustration, and the disclosure is not limited thereto. The sizes and types of probe marks included in different dies 10a and 10b may be similar, the same or different.

The passivation layer 102 is disposed on the interconnection structure IS1 and covers the conductive pad CP1. The passivation layer 102 may include an inorganic dielectric material, an organic dielectric material or a combination thereof. The inorganic dielectric material may include silicon oxide, silicon nitride, silicon oxynitride, or combinations thereof. The organic dielectric material may include a polymer material such as polybenzoxazole (PBO), polyimide (PI), benzocyclobutene (BCB), the like, or a combination thereof. The passivation layer 102 may be a single-layer structure or multi-layer structure. In some embodiments, the passivation layer 102 includes a first passivation layer (not shown) and a second passivation layer (not shown). The first passivation layer may be laterally aside and covers the sidewall of the via portion CPn of the conductive pad CP1. The second passivation layer is disposed on the first passivation layer and covers the sidewall and top surface of the pad portion CP12 of the conductive pad CP1. The first passivation layer and the second passivation layer may be formed of the same material or different materials. In some embodiments, the passivation layer 102 is formed after the testing process is performed. The passivation layers 102 of the dies 10a and 10b cover the probe marks MK1 and MK2 of the conductive pads CP1. In some embodiments, as shown in the enlarged view, a portion of the passivation layer 102 of the die 10a is filled in the recess RC of the probe mark MK1 and in physical contact with the conductive pad CP1. A portion of the passivation layer 102 of the die 10b is filled in the recess RC and laterally surrounded by protrusions PT of the probe mark MK2 of the conductive pad CP1.

In some embodiments, the die 10a/10b has a bonding film 103 formed on the top surface of the passivation layer 102. The bonding film 103 may include a dielectric material, such as silicon oxide, silicon nitride, silicon oxynitride, undoped silicate glass (USG), tetraethyl orthosilicate (TEOS), or combinations thereof. The bonding film 103 is formed by a suitable deposition process, such as chemical vapor deposition (CVD). The boding film 103 may be formed on the passivation layer 102 before the singulation process of the corresponding wafer is performed.

Figure 1C:
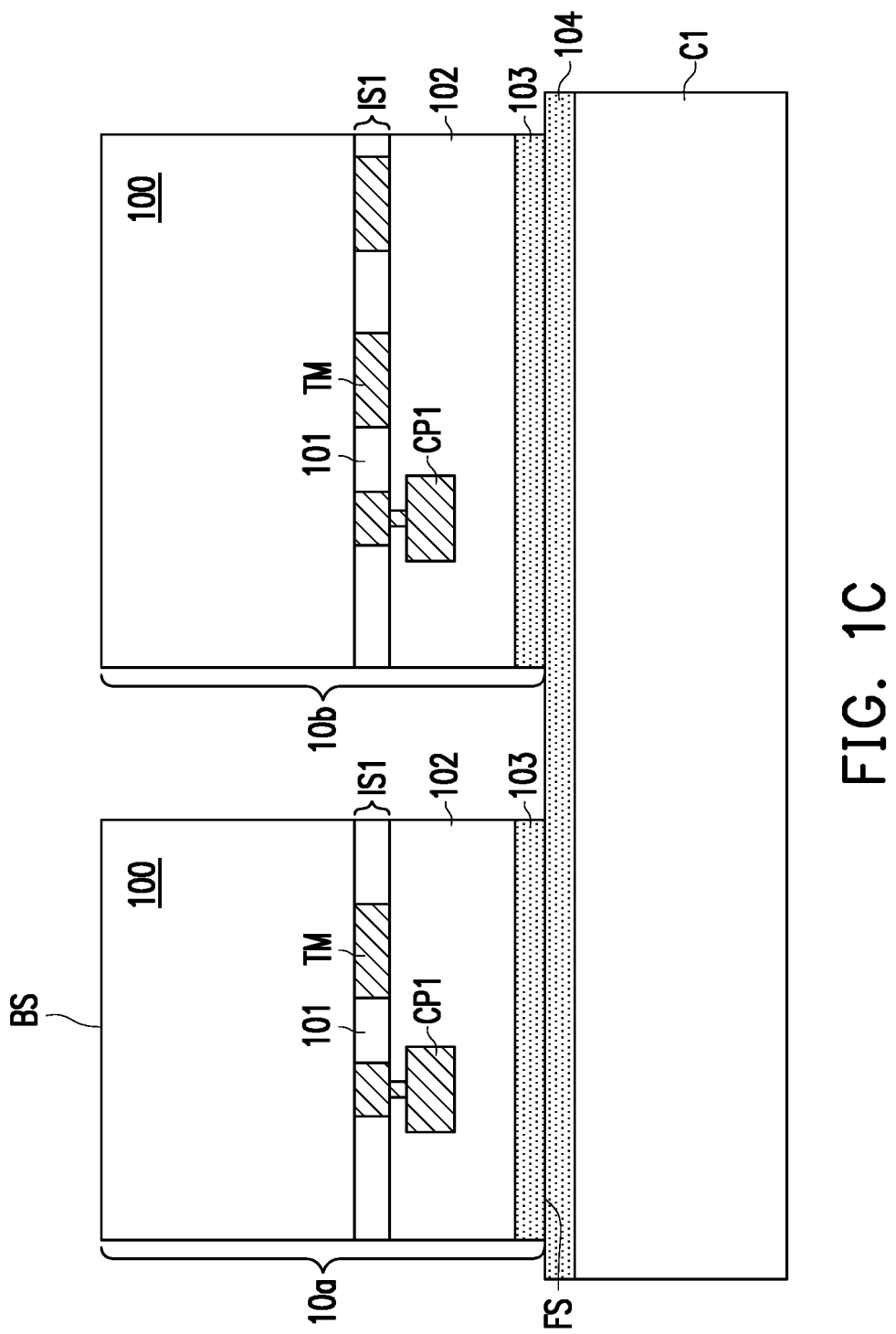

Referring to FIG. 1B and FIG. 1C, the dies 10a and 10b are flipped upside down and mounted on a carrier C1, with the front surfaces FS of the dies 10a and 10b facing the carrier C1. The dies 10a and 10b are disposed side by side and spaced from each other. Although two dies are shown to be mounted on the carrier C1, the number of dies mounted on the carrier C1 is not limited in the disclosure. The carrier C1 may be a temporary carrier which will be removed in the subsequent process. In some embodiments, the dies 10a and 10b are bonded to the carrier C1 through a fusion bonding process. In some embodiment, the carrier C1 is a semiconductor carrier, such as a semiconductor wafer (e.g. silicon wafer). The carrier C1 may be a bare wafer without devices formed therein. The carrier C1 may have a bonding film 104 formed thereon. The bonding film 104 may be formed of a material selected from the same candidate materials of the bonding film 103. However, the disclosure is not limited thereto. In some other embodiments, other types of carrier, such as glass carrier, a ceramic carrier, or the like, may also be used, and the bonding film 104 may be replaced by a release layer which is decomposable under the heat of light to release the overlying structures in the subsequent process. In such embodiments, the bonding film 103 may be omitted.

As shown in FIG. 1C, after the dies 10a and 10b are bonded to the carrier C1, the back surfaces BS (i.e. surfaces of the substrate 100) of the dies 10a and 10b are exposed.

Figure 1D:
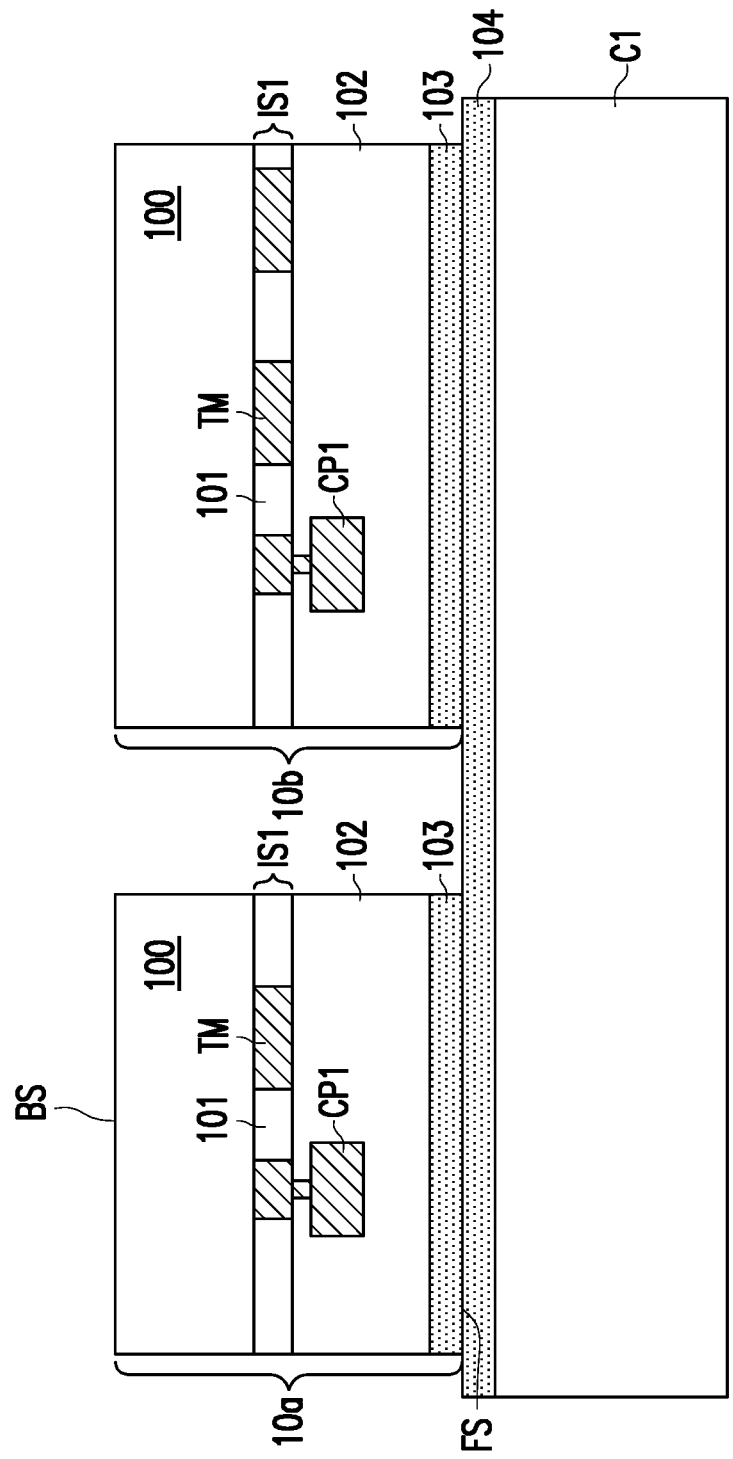

Referring to FIG. 1C and FIG. 1D, in some embodiments, a thinning process is then performed to remove portions of the substrates 100, so as to thin the dies 10a and 10b. The thinning process may include performing a grinding process, a polishing process (e.g. chemical mechanical polishing (CMP)) or a combination thereof.

Figure 1E:
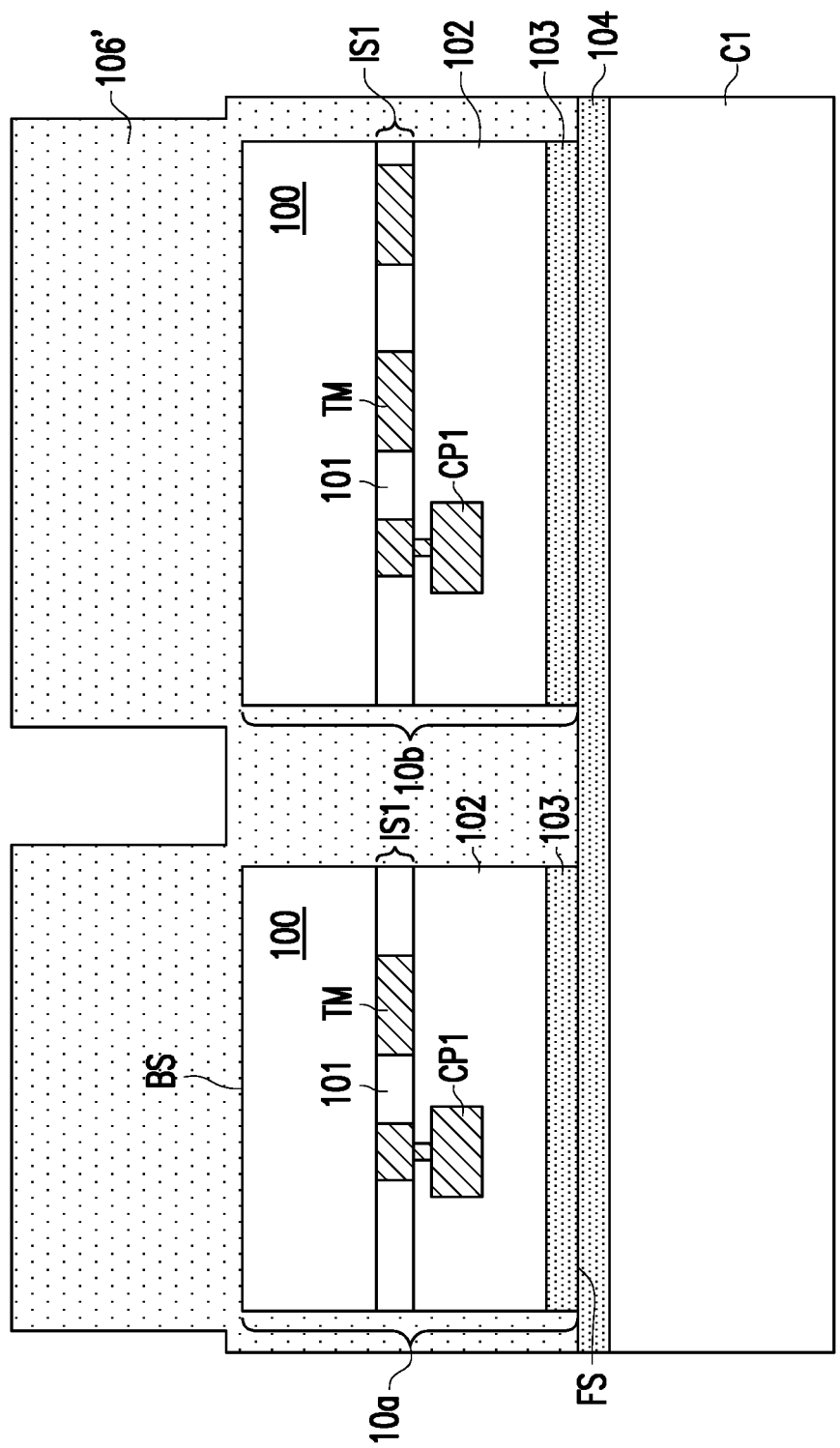

Referring to FIG. 1E, a dielectric material layer 106' is formed on the carrier C1 to cover sidewalls and top surfaces of the dies 10a and 10b. In some embodiments, the dielectric material layer 106' includes silicon oxide, or TEOS, while other dielectric materials such as silicon carbide, silicon oxynitride, silicon oxy-carbo-nitride, PSG, BSG, BPSG, or the like may also be used. The dielectric material layer 106' may be formed using CVD, High-Density Plasma Chemical Vapor Deposition (HDPCVD), flowable CVD, spin-on coating, or the like. The dielectric material layer 106' may has undulated surface. For example, the dielectric material layer 106' may include a body portion covering sidewalls of the dies 10a and 10b, and protrusions covering top surfaces of the dies 10a and 10b. In alternative embodiments, the dielectric material layer 106' may include a molding compound, a molding underfill, a resin such as epoxy, a combination thereof, or the like, and the dielectric material layer 106' may be formed by a molding process, a molding underfilling (MUF) process, or the like. In the embodiments in which the dielectric material layer 106' is formed by a molding process, the dielectric material layer 106' may have a substantially flat top surface (not shown).

Figure 1F:
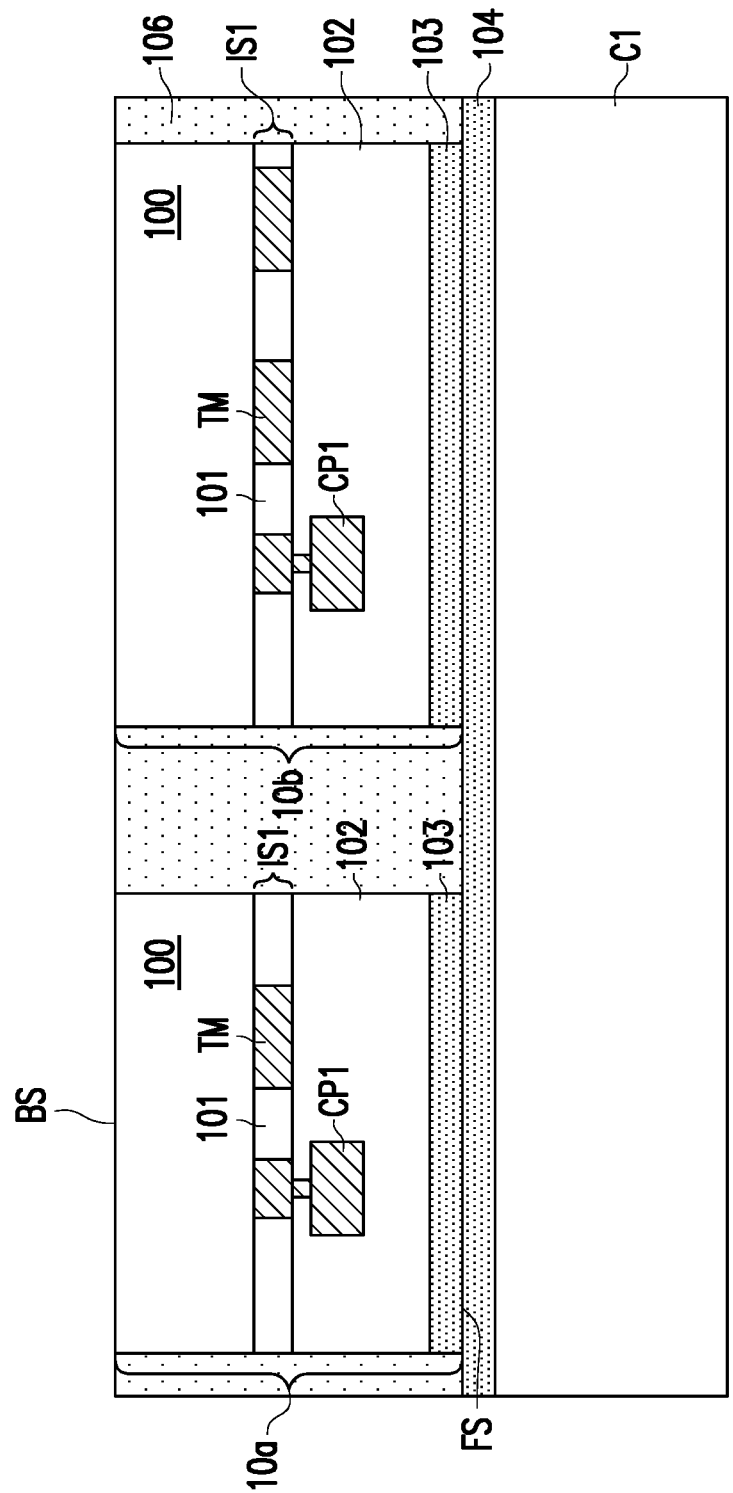

Referring to FIG. 1E and FIG. 1F, a planarization process is performed to remove a portion of the dielectric material layer 106' over the top surfaces of the dies 10a and 10b, and a dielectric layer 106 is formed laterally aside the dies 10a and 10b. The planarization process may include a CMP process.

Referring to FIG. 1F, the dielectric layer 106 covers the sidewalls of the dies 10a and 10b. In some embodiments, the top surface of the dielectric layer 106 is substantially coplanar with the top surfaces of the dies 10a and 10b. In an embodiment, the top surface of the dielectric layer 106 is substantially coplanar with the top surfaces (i.e. back surfaces) of the substrates 100 of the die 10a and 10b. The dielectric layer 106 is referred to as a "gap-fill dielectric layer" or a "gap-fill structure" in some examples.

Figure 1G:
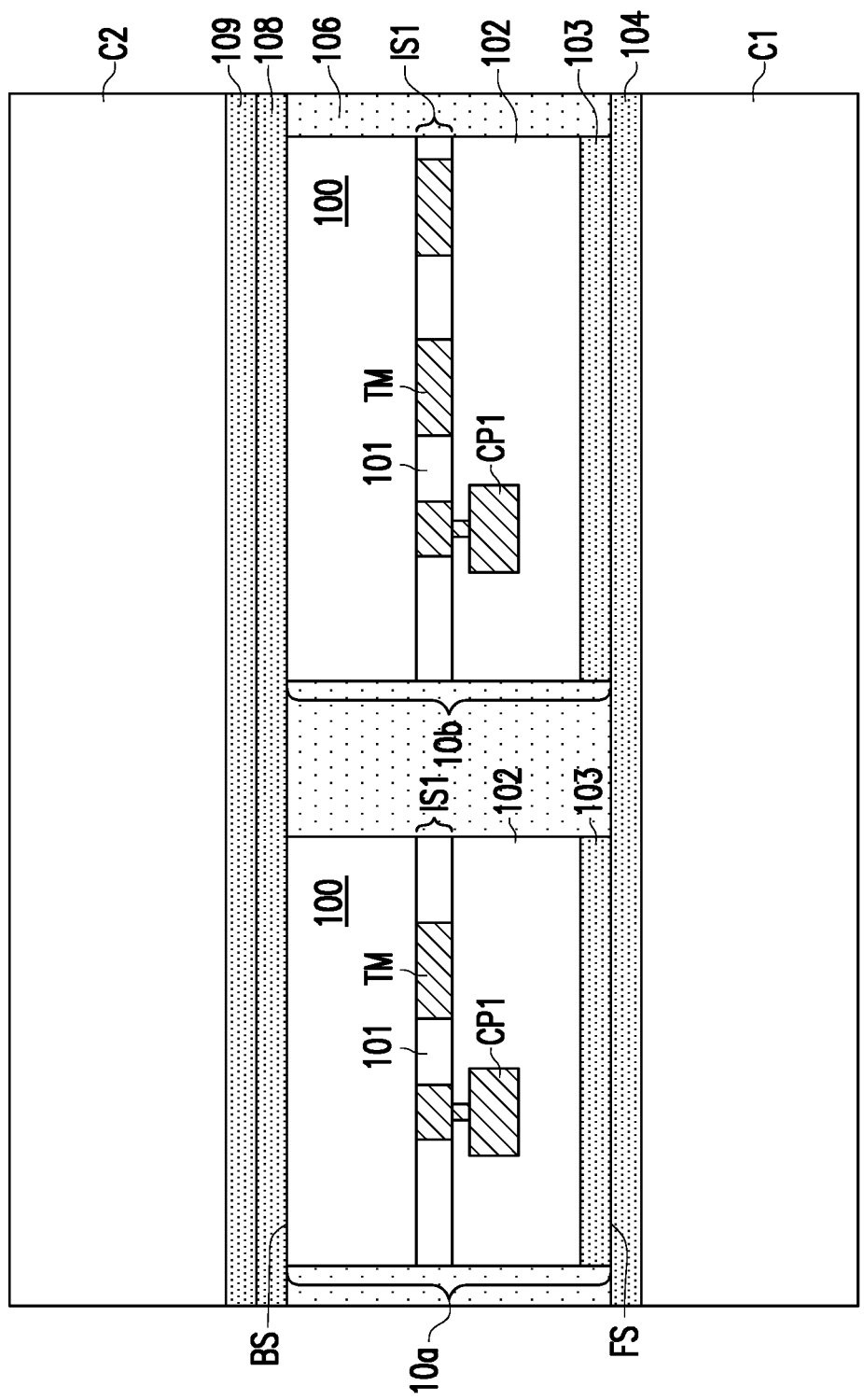

Referring to FIG. 1G, a carrier C2 is bonded to the back sides of the dies 10a and 10b and the dielectric layer 106. The material of the carrier C2 may be the same as or different from that of the carrier C1. In an embodiment, the carrier C2 includes semiconductor materials, such as silicon. For example, the carrier C2 may be a semiconductor wafer, such as a bare silicon wafer without devices formed therein. In other words, the carrier C2 is a device-free carrier. However, the disclosure is not limited thereto. In other embodiments, the carrier C2 includes wiring patterns for electrically connecting the dies 10a and 10b to other components. In some embodiments, the carrier C2 is bonded to the dies 10a and 10b and the dielectric layer 106 through a fusion bonding process. The carrier C2 is a wafer-type carrier at this stage of FIG. 1G, and is subsequently cut into chiplets in the following operation (e.g., FIG. 1J). In some embodiments, the carrier C2 remains in the final product and functions as a support or base for the overlying dies. The carrier C2 is referred to as a "semiconductor support" in some examples.

For example, after the dielectric layer 106 is formed, a bonding film 108 is formed on the top surfaces (i.e. back surfaces) of the dies 10a and 10b and the top surface of the dielectric layer 106. The carrier C2 is provided with a bonding film 109 formed thereon. The bonding films 108 and 109 may include the same or different dielectric materials. The materials of the bonding films 108 and 109 may be selected from the same candidate materials of the bonding films 103 and 104.

In some embodiments, the bonding process may be performed as below: first, to avoid the occurrence of the unbonded areas (i.e. interface bubbles), the to-be-bonded surfaces (that is, the surfaces of the bonding film 108 and the bonding film 109) are processed to be sufficiently clean and smooth. Then, the bonding film 108 on the dies 10a and 10b and the bonding film 109 on the carrier C2 are aligned and placed in physical contact at room temperature with slight pressure to initiate a bonding operation. Thereafter, a thermal treatment such as an annealing process at an elevated temperature is performed to strengthen the chemical bonds between the to-be-bonded surfaces and to transform the chemical bonds into covalent bonds.

Figure 1H:
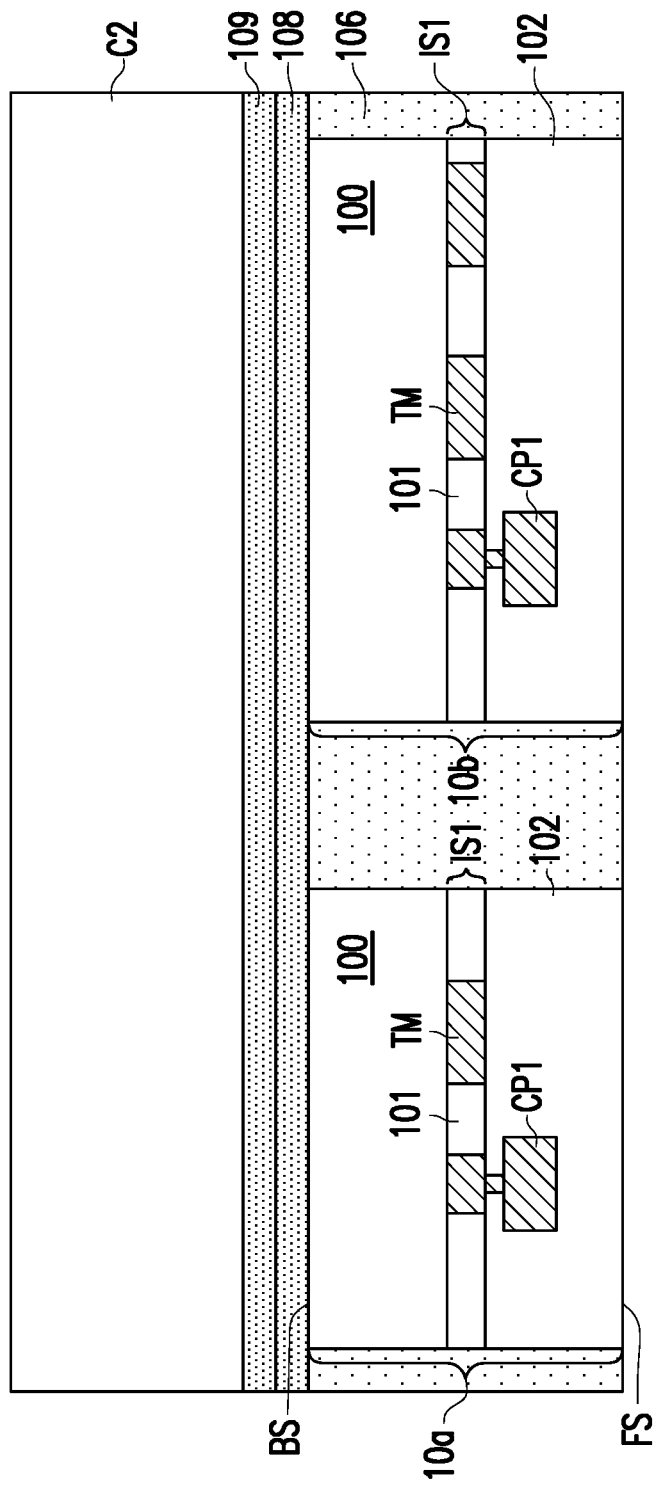

Referring to FIG. 1H, a removal process is performed to remove the carrier C1 from the overlying structure. In some embodiments, the removal process includes a grinding process, a polishing process such as CMP, an etching process such as a wet etching or a dry etching, or a combination thereof. The removal process may be performed until the front surfaces FS of the dies 10a and 10b are exposed. In other words, the bonding films 104 and 103 (FIG. 1G) may also be removed during the removal process, but the disclosure is not limited thereto. In alternative embodiments in which the carrier C1 is a glass or ceramic carrier and the bonding film 104 is replaced by a release layer, the removal process may include irradiating a light on the release layer, and the carrier C1 is released from the overlying structure with the release layer decomposed under the heat of light.

Figure 1I:
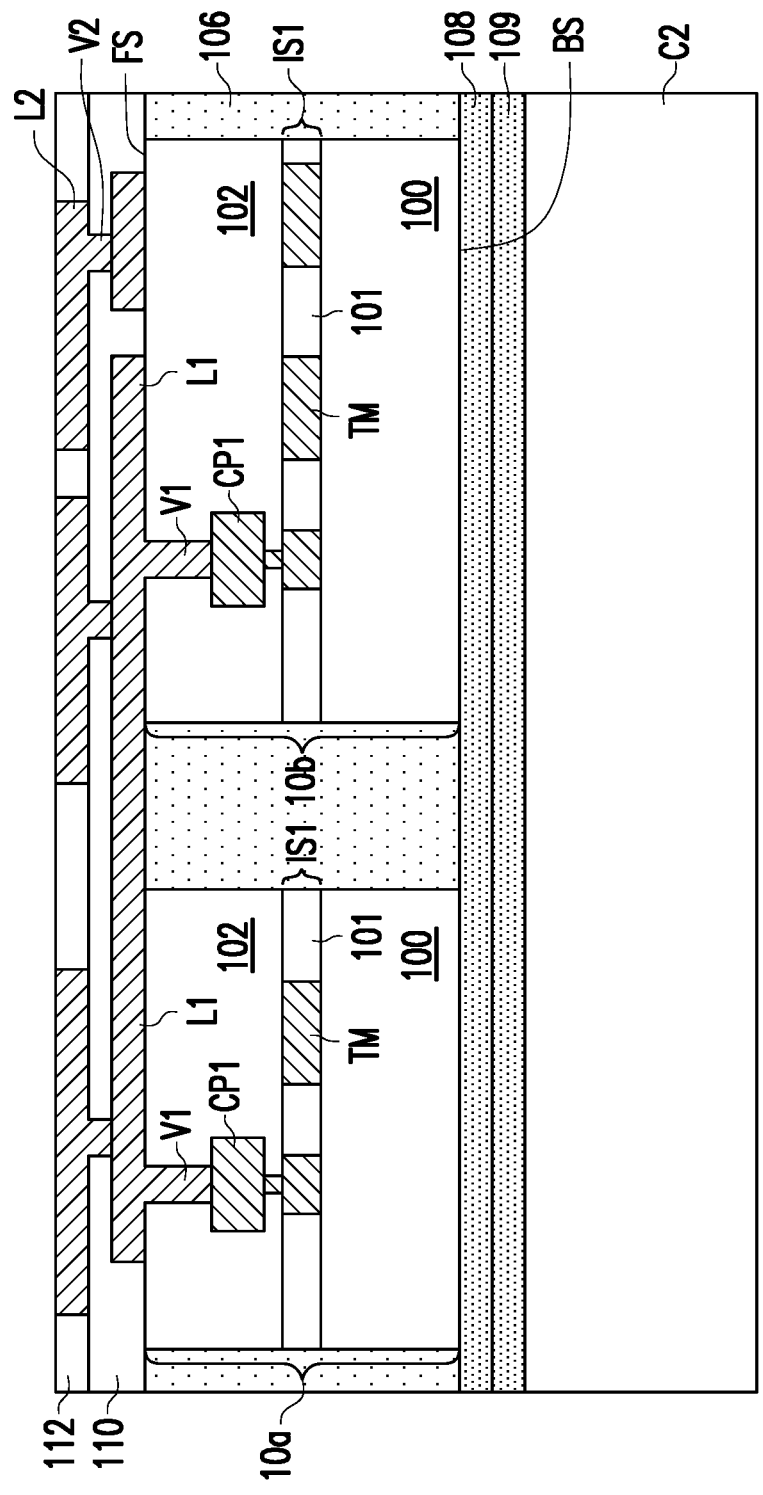

Referring to FIG. 1H and FIG. 1I, the structure of FIG. 1H is flipped upside down, such that the front surfaces FS of the dies 10a and 10b faces upward. In some embodiments, the front surfaces FS (i.e., top surfaces) of the dies 10a and 10b are substantially coplanar with the top surface of the dielectric layer 106.

Referring to FIG. 1I, thereafter, an interconnection structure IS2 is formed on the dies 10a and 10b and the dielectric layer 106. In some embodiments, the interconnection structure IS2 is configured to provide electrical routing between the adjacent dies 10a and 10b. The interconnection structure IS2 is referred to as a "die-interconnection structure" in some examples. The interconnection structure IS2 may include one or more layers of conductive layers and one or more dielectric layers. In some embodiments, the interconnection structure IS2 includes conductive layers M1 and M2, and dielectric layers 100 and 112. In some embodiments, the materials of the dielectric layers and conductive layers of the interconnection structure IS2 may be similar to, substantially the same as or different from those of dielectric layers and conductive features included in the interconnection structure IS1 of the dies 10a and 10b.

The conductive layers M1 and M2 may include metal, metal alloy or a combination thereof. For example, the conductive layers M1 and M2 may include titanium, tungsten (W), copper (Cu), copper alloys, aluminum (Al), aluminum alloys, or combinations thereof. In some embodiments, the conductive layers M1 and M2 may respectively include a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals.

The dielectric layers 100 and 112 may include inorganic dielectric material, organic dielectric material or a combination thereof. The dielectric layers 110 and 112 may include silicon oxide, silicon nitride, silicon oxynitride, silicon carbide, low-K dielectric material, such as un-doped silicate glass (USG), phosphosilicate glass (PSG), boron-doped phosphosilicate glass (BPSG), fluorinated silica glass (FSG), $SiO_xC_y$, Spin-On-Glass, Spin-On-Polymers, silicon carbon material, compounds thereof, composites thereof, combinations thereof, or the like. Polymer materials (such as polybenzoxazole (PBO), polyimide (PI), benzocyclobutene (BCB), or combinations thereof) may also be used to form the dielectric layers 110 and 112.

The conductive layer M1 includes conductive vias V1 and conductive lines L1. In some embodiments, the conductive vias V1 penetrate through the passivation layers 102 to electrically connect to the conductive pads CP1 of the dies 10a and 10b. The conductive lines L1 are disposed on the conductive vias V1 and electrically connected to the conductive pads CP1 of the dies 10a and 10b through the conductive vias V1. The conductive lines L1 are extending and routing along the top surfaces of the dies 10a and 10b and the dielectric layer 106. In some embodiments, the conductive vias V1 and the conductive lines L1 are formed simultaneously without interfaces formed therebetween. For example, the conductive layer M1 may be formed by the following processes: the passivation layers 102 of the dies 10a and 10b are patterned to form via holes exposing portions of the top surfaces of the conductive pads CP1. Thereafter, a seed material layer is formed on the dielectric layer 106, the dies 10a and 10b and lines the via holes by a physical vapor deposition (PVD) process such as sputtering. A patterned mask layer is then formed on the seed material layer. The patterned mask layer has openings exposing portions of the seed layer in the via holes and portions of the seed layer on the top surfaces of the dies and the dielectric layer 106. Thereafter, a metal layer is formed on the seed material layer exposed by the patterned mask layer. Afterwards, the patterned mask layer is removed by a suitable process such as an ashing process, the seed material layer previously covered by the patterned mask layer is removed by an etching process with the metal layer as an etching mask, and the seed layer underlying the metal layer is remained. As such, the metal layer and the underlying seed layer constitute the conductive layer M1.

The above-described forming method of the conductive layer M1 is merely for illustration, and the disclosure is not limited thereto. In alternative embodiments, the conductive vias V1 and the conductive lines L1 may be formed successively, and interfaces may exist between the conductive lines L1 and the conductive vias V1.

In some embodiments in which the conductive pad includes a probe mark, and a via of the conductive layer may land on a region of a pad spaced from the probe mark. Taken the conductive pad CP1 of the die 10a as an example, the conductive via V1 of the conductive layer M1 lands on a location spaced apart from the probe mark MK1 of the conductive pad CP1. In some embodiments, the conductive via V1 is laterally spaced from the probe mark MK1 by a non-zero distance d1.

Still referring to FIG. 1I, the dielectric layer 110 covers sidewalls and top surfaces of the conductive lines L1. The conductive layer M2 penetrates through the dielectric layer 110 to connect to the conductive lines L1 of the conductive layer M1. In some embodiments, the conductive layer M2 includes conductive vias V2 and conductive lines L2 electrically connected to each other. The conductive vias V2 are embedded in and penetrating through the dielectric layer 110 to connect to the conductive layer M1. The conductive lines L2 are disposed on the conductive vias V2 and the dielectric layer 110, and electrically connected to the conductive layer M1 through the conductive vias V2. The dielectric layer 112 is disposed on the dielectric layer 110 and laterally covering sidewalls of the conductive lines L2. The conductive layer M2 may be formed by a suitable deposition process such as PVD, a plating process such as electroplating, or a combination thereof. In some embodiments, the conductive layer M2 may be formed by a damascene process, such as a single-damascene processes or a dual-damascene process. The conductive vias V2 and conductive lines L2 may be formed simultaneously or successively, and interfaces may or may not exist between the conductive vias V2 and the conductive lines L2.

Figure 1J:
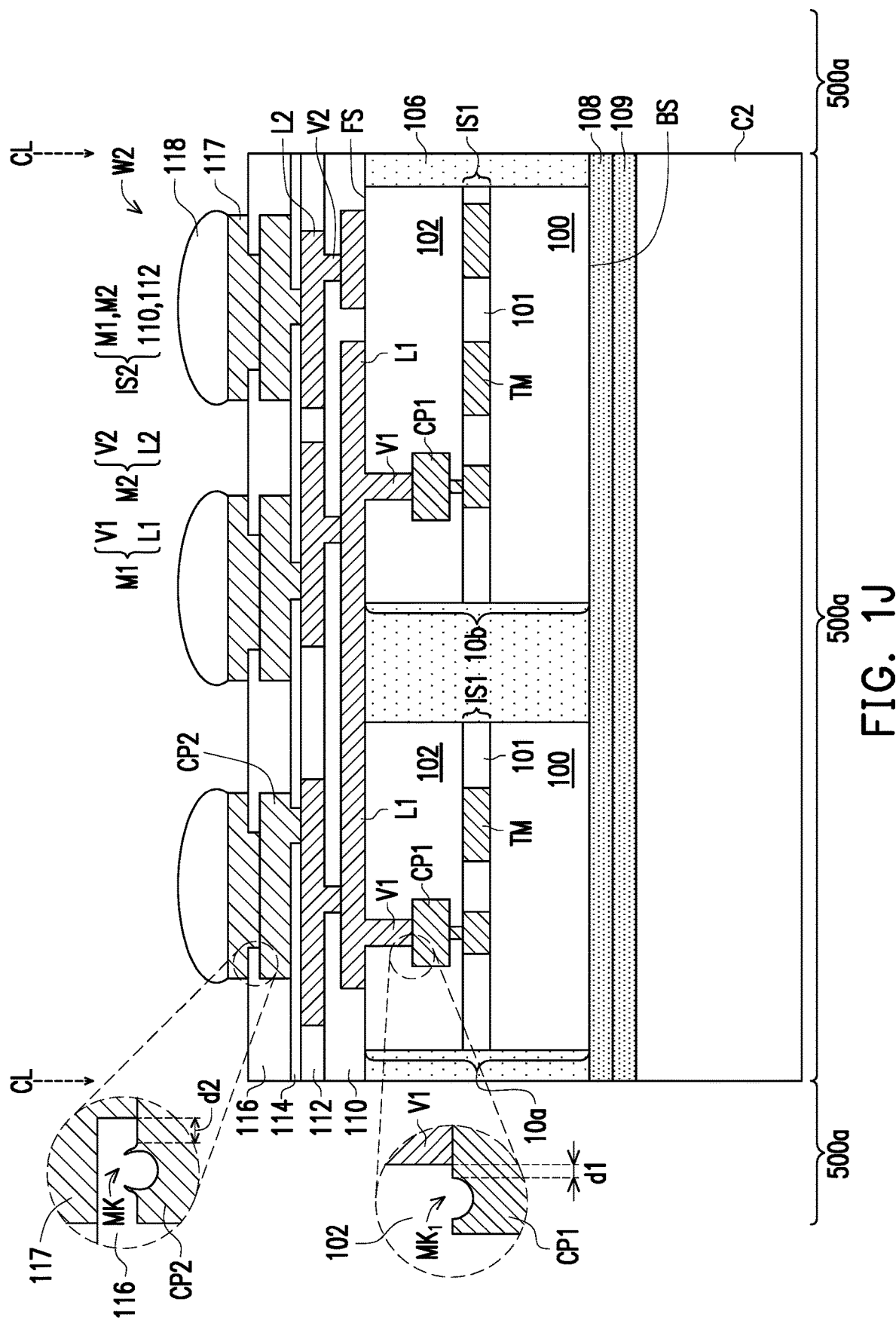

Referring to FIG. 1J, after the interconnection structure IS2 is formed, a passivation layer 114 is formed on the interconnection structure IS2. Conductive pads CP2 are then formed on and penetrate through the passivation layer 114 to electrically connect to the topmost conductive layer (e.g. the conductive layer M2) of the interconnection structure IS2. In some embodiments, each conductive pad CP2 includes a via portion embedded in the passivation layer 114 and a pad portion on the via portion and the passivation layer 114. The material of the conductive pads CP2 may be the same as or different from the material of the conductive pads CP1. The conductive pads CP2 may include a suitable metallic material, such as aluminum, copper, alloys thereof, or combinations thereof. In some embodiments, the conductive pads CP2 are aluminum pads or aluminum-copper pads.

In some embodiments, after the conductive pads CP2 are formed, a testing process (e.g. probe testing process) may be performed on at least one of the conductive pads CP2. The testing process performed on the conductive pad CP2 may be similar to the above-described testing process performed on the conductive pad CP1. In some embodiments, after the probe testing process is performed on the conductive pad CP2, a probe mark MK may be formed in the top surface of the conductive pad CP2. The probe mark MK may be similar to the probe mark MK1 or MK2 of the conductive pad CP1, as described in FIG. 1B. For example, the probe mark MK may include dent(s), recess(es), protrusion(s) or combinations thereof.

In some embodiments, a passivation layer 116 is formed over the passivation layer 114 to partially cover the conductive pads CP2. The passivation layers 114 and 116 may respectively be a single layer or a composite layer, and may be formed of a non-porous material. Each of the passivation layers 114 and 116 may include silicon oxide, silicon nitride, or a combination thereof. In some embodiments, at least one of passivation layers 114 and 116 is a composite layer including a silicon oxide layer (not shown separately), and a silicon nitride layer (not shown separately) over the silicon oxide layer. The passivation layers 114 and 116 may also be formed of other non-porous dielectric materials such as Un-doped Silicate Glass (USG), silicon oxynitride, and/or the like, or combinations thereof.

In some embodiments, the passivation layer 116 is patterned to have multiple openings that expose portions of the conductive pads CP2 for further connection.

In some embodiments, the structure underlying conductive pads CP2 is free from organic materials (such as free of polymer layers), so that the process for forming the structures underlying conductive pads CP2 may adopt the process (e.g. advanced process node) used for forming device dies. In some embodiments, the interconnection structure IS2 is formed by back-end-of-line (BEOL) process similar to the forming process of interconnection structure IS1 within the dies 10a and 10b, such that conductive layers (such as M1 or M2) having fine pitches and line widths are made possible. In some embodiments, the pitch of the conductive layers M1/M2 (e.g. pitch between adjacent conductive lines L1 or pitch between adjacent conductive lines L2) may be about 1 μm or less, such as about 0.8 μm or less. However, the disclosure is not limited thereto. In some other embodiments, polymer materials may also be used for forming the interconnection structure IS2.

In some embodiments, a plurality of conductive patterns 117 are formed on and electrically connected to the conductive pads CP2 exposed by the passivation layer 116, and a plurality of connectors 118 are formed on and electrically connected to the conductive patterns 117. In some embodiments, the conductive patterns 117 may be conductive pillars such as copper pillars. The material of the connectors 118 may include copper, aluminum, lead-free alloys (e.g., gold, tin, silver, aluminum, or copper alloys) or lead alloys (e.g., lead-tin alloys). In some embodiments, the connectors 118 may be formed of a Sn—Ag alloy, a Sn—Cu alloy, a Sn—Ag—Cu alloy, or the like, and may be lead-free or lead-containing. The connectors 118 may be formed by a suitable process such as evaporation, plating, ball dropping, screen printing and reflow process, a ball mounting process or the like. In some embodiments, the connectors 118 include solder materials and may also be referred to as solder balls or micro bumps.

In some alternative embodiments, a post-passivation layer (not shown) may further be formed on the passivation layer 116. The post-passivation layer includes a polymer material such as, polyimide (PI), polybenzoxazole (PBO), benzocyclobutene (BCB) or the like, or combinations thereof. The conductive patterns 117 penetrate through the optional post-passivation layer and the passivation layer 116 to connect to the conductive pads CP2. In such embodiments, the conductive patterns 117 may be under-bump metallurgies (UBMs), and the connectors 118 may be solder balls, controlled collapse chip connection (C4) bumps, ball grid array (BGA) connectors, or the like.

In some embodiments, the position relation of the conductive pad CP2, the passivation layer 116 and the conductive pattern 117 may be similar to the position relation of the conductive pad CP1, the passivation layer 102 and the conductive via V1. In the embodiments in which the conductive pad CP2 includes probe mark MK, a portion of the passivation layer 116 may be filled in a recess of the probe mark MK and/or laterally aside or surrounded by protrusions of the probe mark MK. A portion of the conductive pattern 117 is embedded in the passivation layer 116 and in physical contact with the conductive pad CP2, and the portion of the conductive pattern 117 is spaced from the probe mark MK by a non-zero distance d2.

Figure 2:
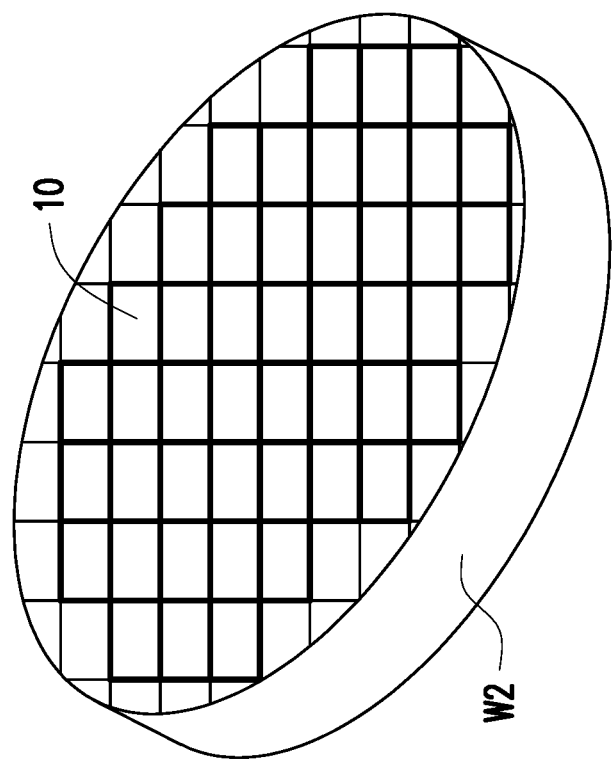
FIG. 2 illustrates a perspective view of a reconstructed wafer according to some embodiments of the disclosure.

Referring to FIG. 1J and FIG. 2, in some embodiments, a reconstructed wafer W2 is thus formed, the reconstructed wafer W2 includes a plurality of dies 10, wherein the dies 10a and 10b are two of the dies 10 included in the reconstructed wafer W2. In some embodiments, all of the dies 10 included in the reconstructed wafer W2 have been subjected to a testing process before singulated from its original wafer, such as the wafer W1. In other words, all of the dies 10 included in the reconstructed wafer W2 are known good dies.

Figure 1K:
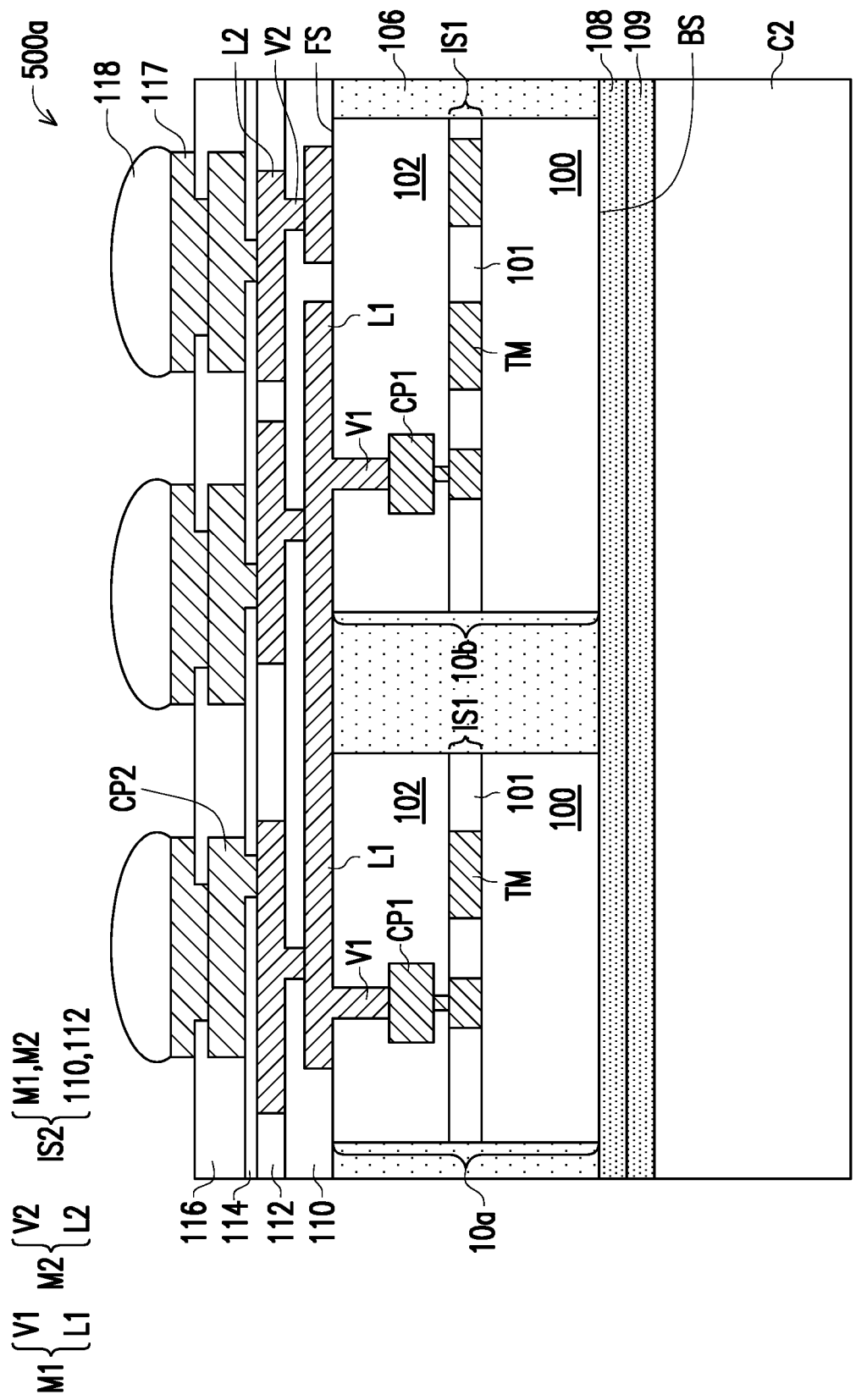

Referring to FIG. 1J and FIG. 1K, in some embodiments, a singulation process (i.e. die saw process) is performed on the reconstructed wafer W2 along the cutting lines CL, so as to form a plurality of singualted semiconductor structures 500a. In some embodiments, the semiconductor structure 500a may also be referred to as a "reconstructed die" or a "(reconstructed) system on integrated chip (SoIC)". The carrier C2 is a chip-type carrier at this stage of FIG. 1K.

In some embodiments, each of the semiconductor structures 500a includes one or more known good dies. For example, each semiconductor structure 500a includes two dies 10a and 10b, but the disclosure is not limited thereto. The number of the dies included in a semiconductor structure 500a may be adjusted according to product design and requirement. In some embodiments, the number of dies included in different semiconductor structures singulated from the reconstructed wafer W2 may be the same or different.

Referring to FIG. 1K, in some embodiments, each semiconductor structure 500a includes a carrier C2, two dies 10a and 10b, a dielectric layer 106, an interconnection structure IS2, a passivation layers 114 and 116, conductive pads CP2, and connectors 118. The dies 10a and 10b are disposed on the carrier C2. The dielectric layer 106 laterally wraps around dies 10a and 10b. In some embodiments, the dies 10a and 10b and the dielectric layer 106 are bonded to the carrier C2 through the bonding films 108 and 109. The interconnection structure IS2 is disposed on the dies 10a and 10b and the dielectric layer 106 and provides the electrical connection between the dies 10a and 10b. The conductive pads CP2 are disposed on and the electrically connected to the interconnection structure IS2, serving as an external connection of the semiconductor structure 500a. The connectors 118 are electrically connected to the dies 10a and 10b through the conductive pads CP2 and the interconnection structure IS2. In some embodiments, the connectors 118 may also be referred to as conductive terminals.

In some embodiments, the bonding films 108 and 109 have the same widths. The sidewall of the carrier C2, the sidewalls of the bonding films 108 and 109, the sidewall of the dielectric layer 106 and the sidewall of the interconnection structure IS2 are substantially aligned with each other.

In some embodiments, the carrier C2 is a semiconductor substrate such as a silicon substrate. In other words, the semiconductor structure 500a includes a semiconductor support (e.g., carrier C2), and a plurality of semiconductor substrates 100 included in the dies 10a and 10b. The semiconductor support C2 (e.g., carrier C2) continuously extends from a first end to a second end of the semiconductor structure 500a. The semiconductor substrates 100 are parts of the dies 10a and 10b, and spaced from each other by the dielectric layer 106 therebetween. In other words, the semiconductor substrates 100 are non-continuous.

Each of the dies 10a and 10b includes an interconnection structure IS1 for interconnecting the devices formed in and/or on the substrate 100 thereof. The interconnection structure IS2 is disposed on the dies 10a and 10b for interconnecting the die 10a and the die 10b. In some embodiments, both of the interconnection structure IS1 and the interconnection structure IS2 are formed using BEOL process, so as to have fine-pitch conductive lines. In some embodiments, the pitch of the conductive lines included in the interconnection structure IS2 may be substantially equal to the pitch of the conductive lines included in the interconnection structure IS1. However, the disclosure is not limited thereto. In some other embodiments, the pitch of conductive lines included in the interconnection structure IS2 may be slightly larger than or less than the pitch of conductive lines included in the interconnection structure IS1.

In some embodiments, at least some of the conductive pads CP1 of the dies 10a and 10b and the conductive pads CP2 on the interconnection structure IS2 respectively include probe marks (e.g. MK1, MK2, MK) on the surfaces thereof, and at least some of the conductive features (e.g. the conductive vias V1, the conductive patterns 117) landing thereon are spaced apart from the probe marks. In some embodiments, some of the conductive features (e.g. the conductive vias V1, the conductive patterns 117) land on the conductive pads CP1 and CP2 that are free of probe marks.

In some other embodiments, the die 10a and/or the die 10b may be singulated from a high yield wafer, and may not be subjected to probe testing process before the singulation process of the high yield original wafer. Accordingly, the die 10a and/or the die 10b from high yield wafer(s) may be free of a probe mark on the surface thereof. In some embodiments, one of the dies 10a and 10b includes a conductive pad CP1 free of probe mark, while the other one of the dies 10a and 10b includes a conductive pad CP1 with a probe mark, and the conductive pad CP2 includes a probe mark. In yet another embodiment, both of the dies 10a and 10b include conductive pads CP1 free of probe marks, while the conductive pad CP2 includes a probe mark.

FIG. 3A to FIG. 3D are cross-sectional views illustrating semiconductor structures singulated from reconstructed wafers according to some other embodiments of the disclosure.

Figure 3A:
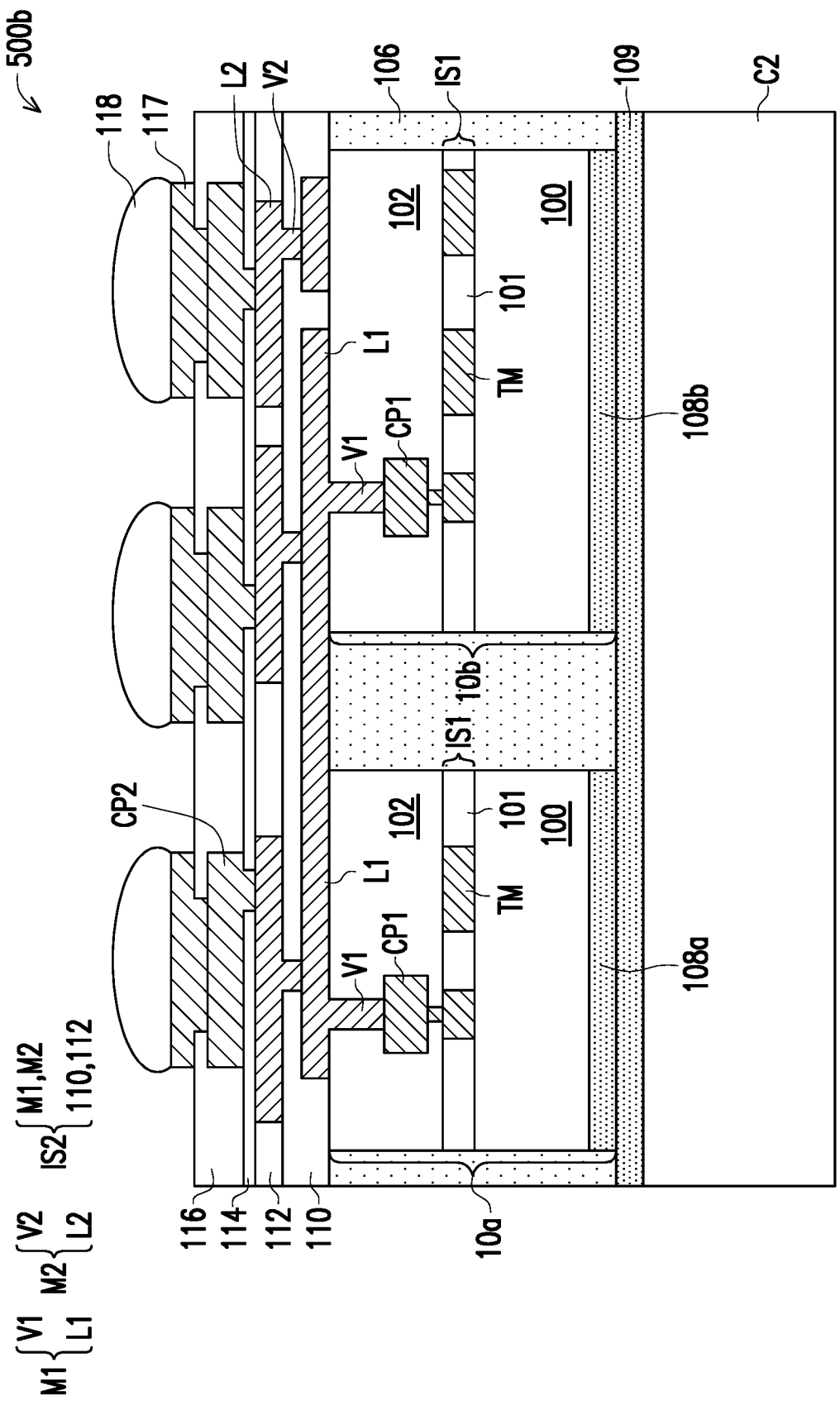
FIG. 3A to FIG. 3D are schematic cross-sectional views illustrating semiconductor structures according to some embodiments of the disclosure.

Referring to FIG. 3A, a semiconductor structure 500b is illustrated. The semiconductor structure 500b is similar to the semiconductor structure 500a, except that the bonding film 108 is not disposed between the dielectric layer 106 and the bonding film 109. In some embodiments, a bonding film 108a is disposed between the die 10a and the bonding film 109, and a bonding film 108b is disposed between the die 10b and the bonding film 109. The widths of the bonding film 108 and 108b are less than the width of the bonding film 109, and may be substantially equal to the widths of the corresponding dies 10a and 10b, respectively. In some embodiments, the sidewall of the bonding film 108a is substantially aligned with the sidewall of the die 10a, and the sidewall of the bonding film 108b is substantially aligned with the sidewall of the die 10b. The dielectric layer 106 further extends to warp around sidewalls of the bonding films 108a and 108b and contacts the top surface of the bonding film 109. The other structural features of the semiconductor structure 500b are substantially the same as those of the semiconductor structure 500a, which are not described again here.

Figure 3B:
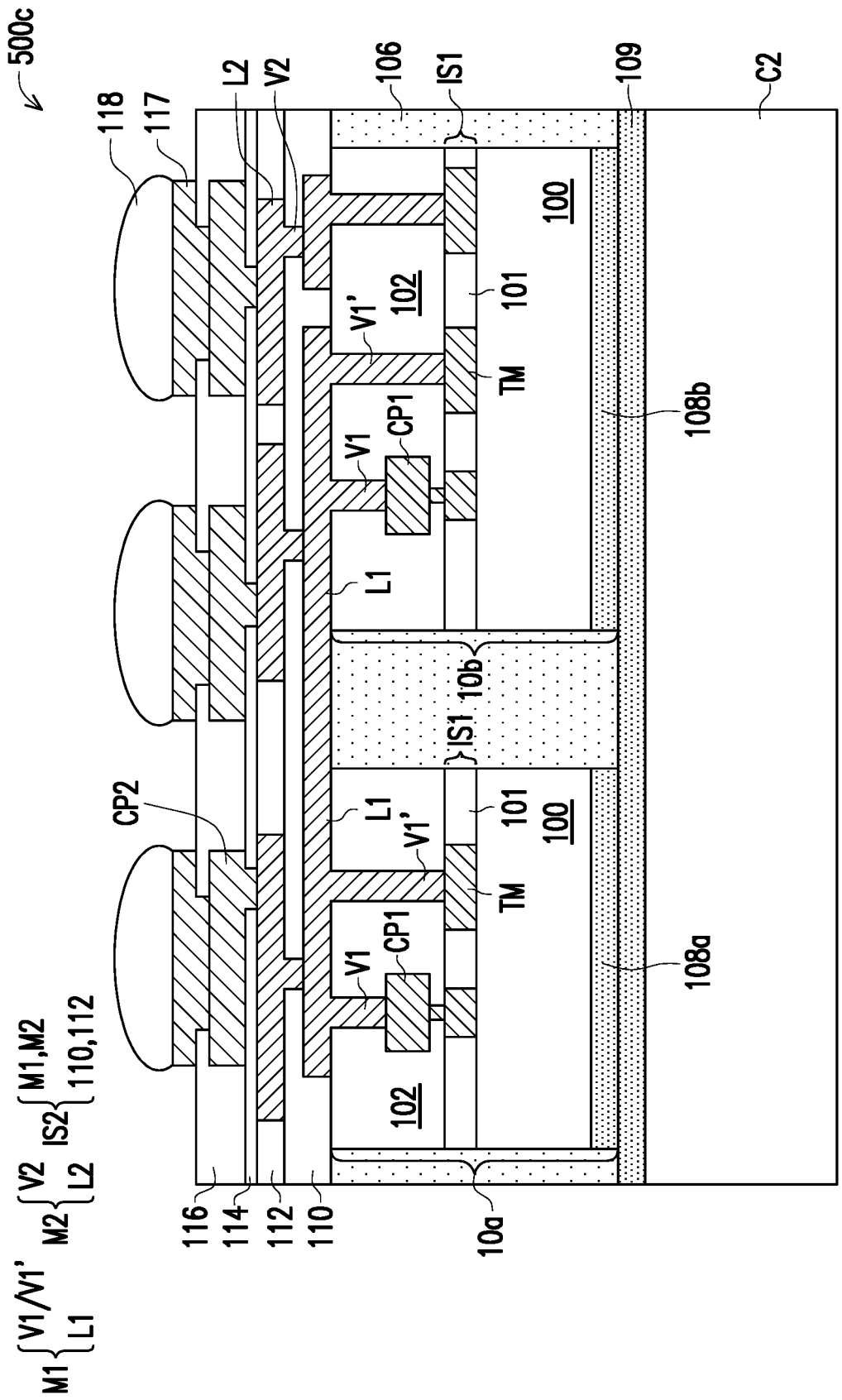

FIG. 3B illustrates a semiconductor structure 500c similar to the semiconductor structure 500b, except that conductive layer M1 of the interconnection structure IS2 further includes conductive vias V1'. As shown in FIG. 3B, in some embodiments, the conductive layer M1 of the interconnection structure IS2 includes the conductive vias V1 and V1' and the conductive line L1 connected to the conductive vias V1 and V1'. The conductive vias V1 are landing on the conductive pads CP1 of the dies 10a and 10b. The conductive vias V1' penetrate through the passivation layers 102 and land on the top conductive features TM of the interconnection structures IS1 of the dies 10a and 10b. The height of the conductive vias V1 is less than the height of conductive vias V1'. In some other embodiments, the conductive layer M1 includes the conductive vias V1', while the conductive vias V1 landing on the conductive pads CP1 may be omitted.

Figure 3C:
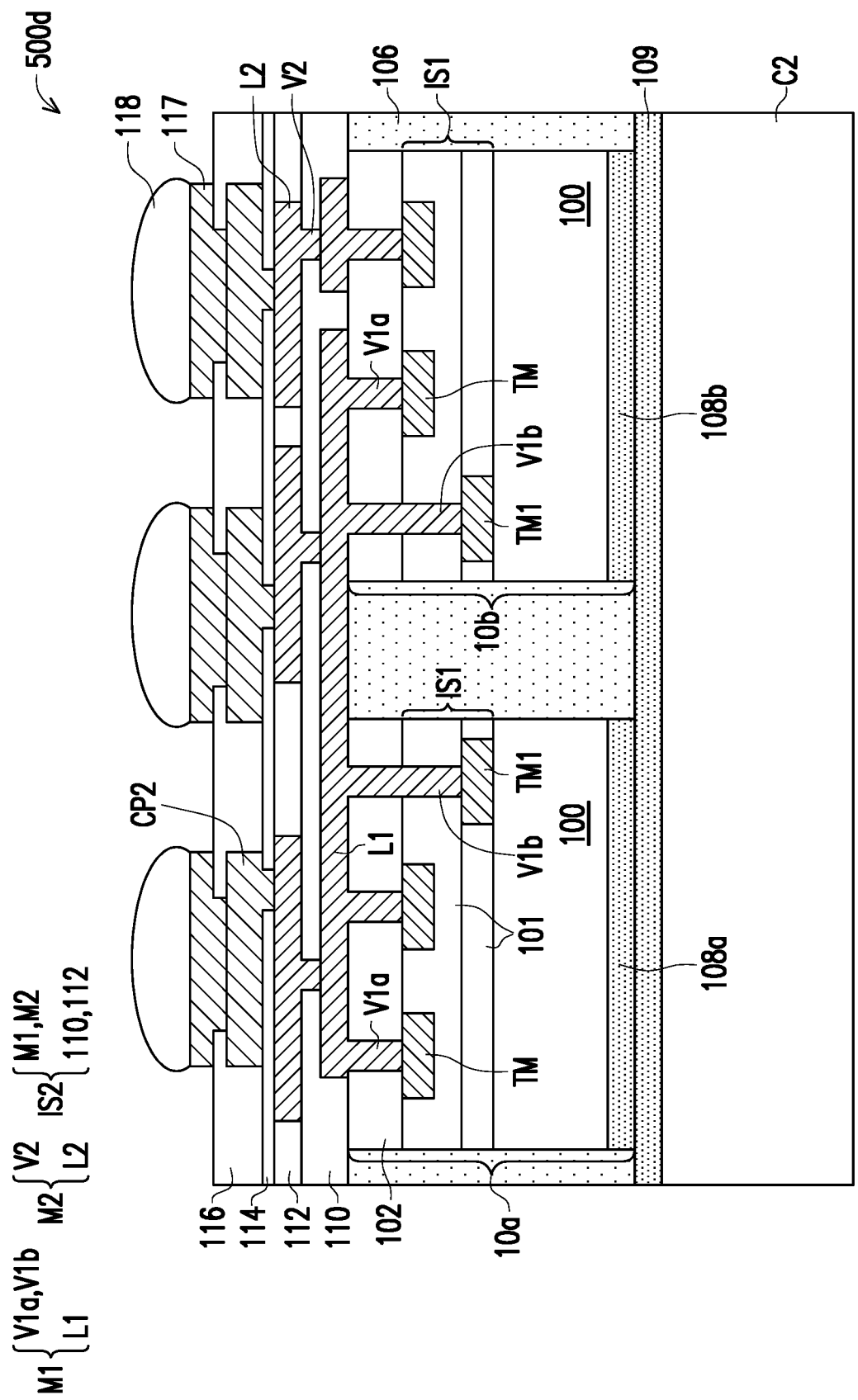

FIG. 3C illustrates a semiconductor structure 500d similar to the above-described semiconductor structures, the differences are described as below. Referring to FIG. 3C, in some embodiments, the dies 10a and 10b may be free of conductive pads or testing pads. The dies 10a and 10b may be singulated from high yield wafer(s) without being subjected to probe testing process. The conductive layer M1 of the interconnection structure may include conductive vias landing on the same or different levels of conductive features of the interconnection structure IS1 of the dies 10a and 10b. For example, the conductive layer M1 includes conducive vias V1a and V1b electrically connected to the conductive line L1. In some embodiments, the conductive vias V1a and V1b land on different levels of the conductive features in the interconnection structure IS1. For example, the conductive vias V1a are landing on the top (i.e. topmost) conductive features TM of the interconnection structures IS1, while the conductive vias V1b are landing on the conductive features TM1 which is located in a level lower than the topmost conductive features TM. In some embodiments, the conductive features TM1 are the second topmost conductive features TM1. However, the disclosure is not limited thereto.

Figure 3D:
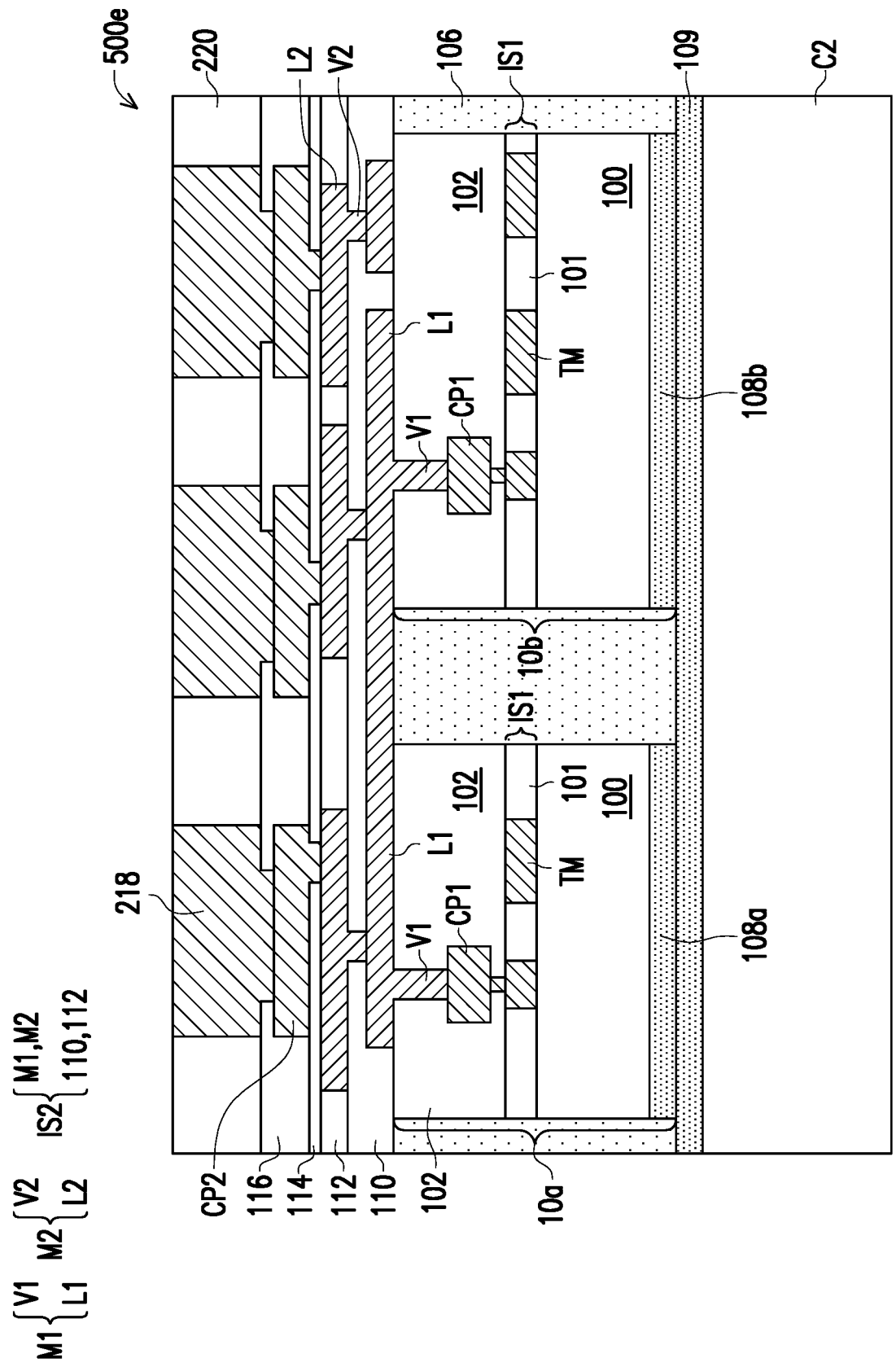

FIG. 3D illustrates a semiconductor structure 500e similar to the semiconductor structure 500b (FIG. 3A), except that the connectors 118 and the conductive pads 117 are replaced by connectors 218, and a passivation layer 220 is further formed on the passivation layer 116 and laterally aside the connectors 218.

Referring to FIG. 3D, in some embodiments, after the passivation layer 116 is formed, a plurality of connectors 218 are formed to penetrate through the passivation layer 116 and electrically connect to the conductive pads CP2. The connectors 218 include copper bumps, copper posts, copper pillars, gold bumps, or the like or other suitable metallic bumps. The passivation layer 220 is formed on the passivation layer 116 and laterally aside the connectors 218 to cover the sidewalls of the connectors 218. The material of the passivation layer 220 may be the same as or different form that of the passivation layer 116. In some embodiments, the passivation layer 220 includes a polymer material, such as PI, PBO, BCB, or the like, or combinations thereof. In some embodiments, the top surface of the passivation layer 220 is substantially coplanar with the top surfaces of the connectors 218. The top surfaces of the connectors 218 and the passivation layer 220 constitute an active surface (or referred to as a front surface) of the semiconductor structure 500e.

In some embodiments, the above-described semiconductor structure 500a-500e may also be referred to "reconstructed dies" or SoIC. The reconstructed dies/SoICs 500a-500e may further be integrated into various types of package structures, such as, integrated fan-out package integrated fan-out (InFO) packages, package-on-package (POP), chip-on-wafer (CoW) packages or chip-on-wafer-on-substrate (CoWoS) package, three-dimensional integrated circuits (3DICs) or combinations thereof. The details are described as below taken the reconstructed die 500e as an example.

Figure 4:
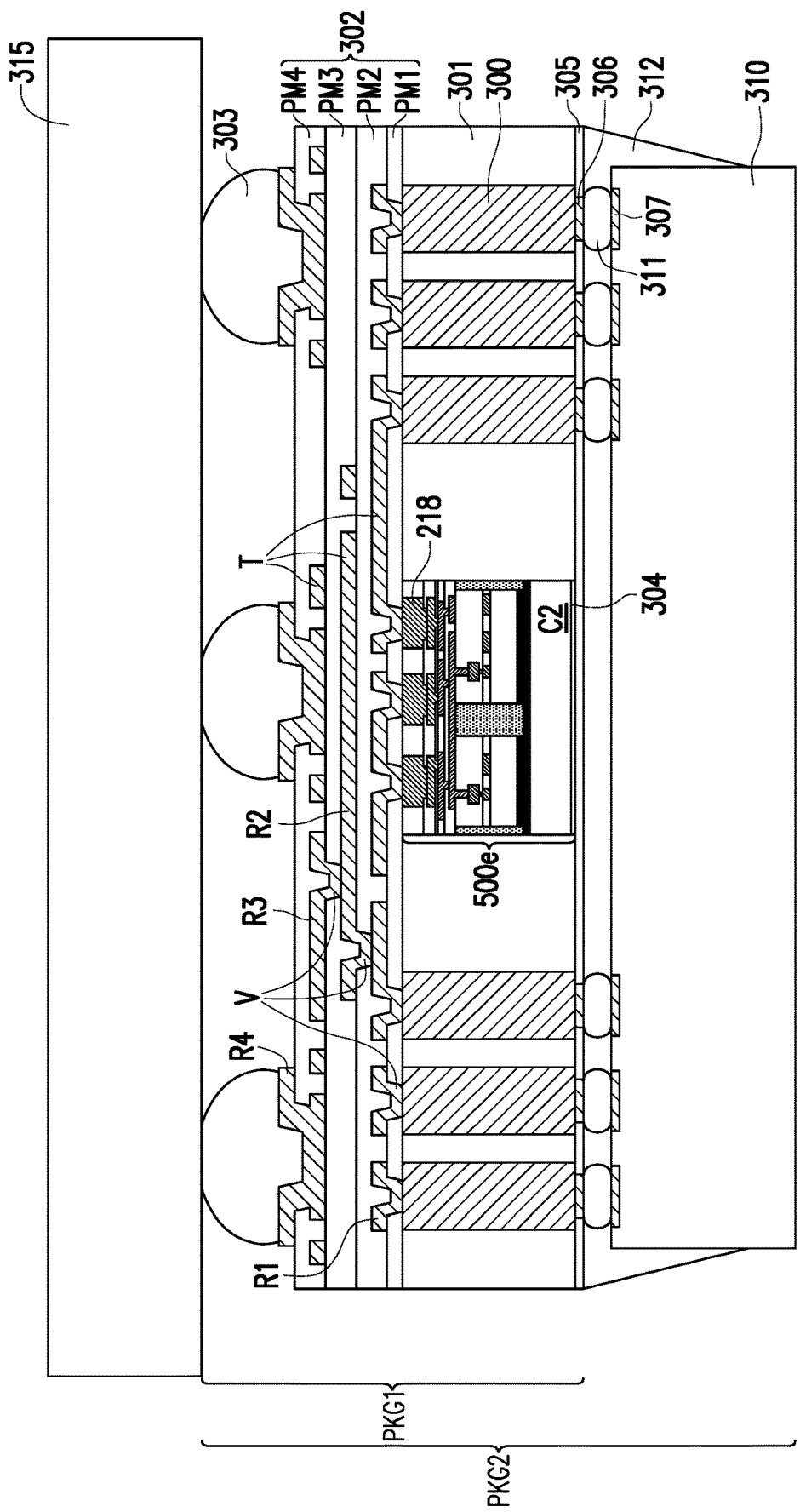
FIG. 4 and FIG. 5 are schematic cross-sectional views illustrating package structures according to some embodiments of the disclosure.
Figure 5:
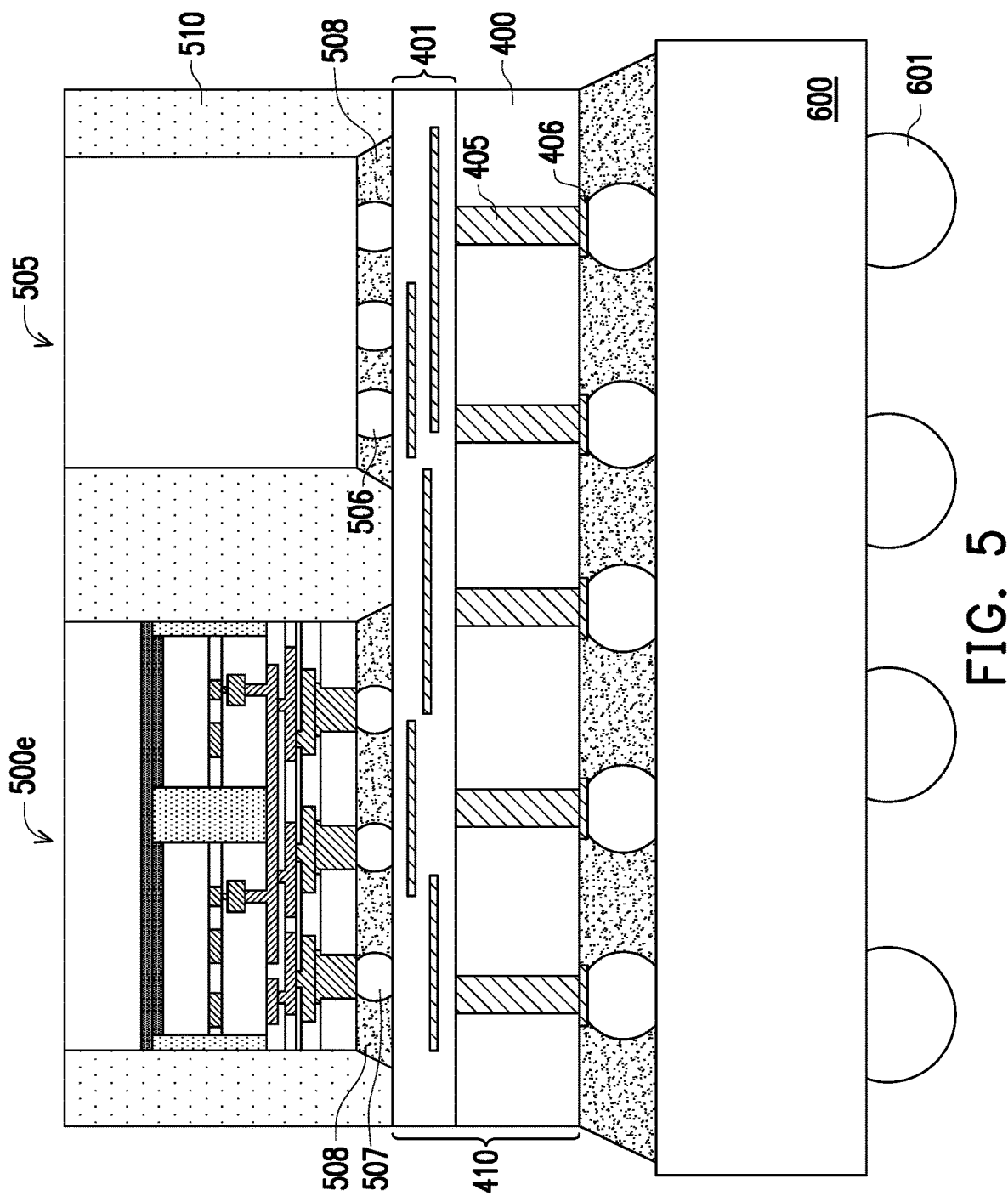

FIG. 4 and FIG. 5 are cross-sectional views illustrating package structures including the reconstructed die 500e in according with some embodiments of the disclosure.

Referring to FIG. 4, in some embodiments, the reconstructed die 500e is further integrated into a package structure PKG1. The package structure PKG1 may be an InFO package. In some embodiments, the package structure PKG1 includes a reconstructed die 500e, a plurality of through integrated fan-out vias (TIVs) 300, an encapsulant 301, a redistribution layer (RDL) structure 302, and connectors 303. The TIVs 300 are disposed laterally aside the reconstructed die 500e. In some embodiments, each TIV 300 includes a seed layer and a conductive post formed on the seed layer. The seed layer may be a metal seed layer such as a copper seed layer. In some embodiments, the seed layer includes a first metal layer such as a titanium layer and a second metal layer such as a copper layer over the first metal layer. The conductive post may include copper or other suitable metals.

The encapsulant 301 is disposed laterally aside the reconstructed die 500e to encapsulate sidewall of the reconstructed die 500e and sidewalls of the TIVs 300. In some embodiments, the encapsulant 301 includes a molding compound, a molding underfill, a resin such as epoxy, combinations thereof, or the like. In some other embodiments, the encapsulant 301 includes a photo-sensitive material such as polybenzoxazole (PBO), polyimide, benzocyclobutene (BCB), combinations thereof, or the like, which may be easily patterned by exposure and development processes or laser drilling process. In alternative embodiments, the encapsulant 301 includes nitride such as silicon nitride, oxide such as silicon oxide, phosphosilicate glass (PSG), borosilicate glass (BSG), boron-doped phosphosilicate glass (BPSG), combinations thereof, or the like.

In some embodiments, the encapsulant 301 includes a molding compound, which may be a composite material including a base material (such as polymer) and a plurality of fillers distributed in the base material. In some embodiments, the base material includes resins, such as epoxy resins, phenolic resins or silicon-containing resins, or the like or combinations thereof. The fillers may include a single element, a compound such as nitride, oxide, or a combination thereof. For example, the fillers may include silicon oxide, aluminum oxide, boron nitride, alumina, silica, or the like, or combinations thereof. In some embodiments, the fillers may be spherical filler particles. The cross-section shape of the filler may be circle, oval, or any other suitable shape. The fillers may include solid fillers, hollow fillers or combinations thereof.

In some embodiments, the top surface of the encapsulant 301, the top surfaces of TIVs 300 and the top surface (i.e. front surface) of the reconstructed die 500e are substantially coplanar with each other.

The RDL structure 302 is disposed over and electrically connected to the reconstructed die 500e, the TIVs 300 and the encapsulant 301. In some embodiments, the RDL structure 302 is disposed on front-side of the reconstructed die 500e and may also be referred to as a "front-side RDL structure", wherein the "front-side" refers to a side close to the connectors 218 of the reconstructed die 500e. In some embodiments, the RDL structure 302 includes a plurality of polymer layers PM1, PM2, PM3 and PM4 and a plurality of redistribution layers R1, R2, R3 and R4 stacked alternately. The numbers of the polymer layers and the redistribution layers shown in FIG. 4 are merely for illustration, and the disclosure is not limited thereto.

The redistribution layer R1 penetrates through the polymer layer PM1 and is electrically connected to the connectors 218 of the reconstructed die 500e and the TIVs 300. The redistribution layer R2 penetrates through the polymer layer PM2 and is electrically connected to the redistribution layer R1. The redistribution layer R3 penetrates through the polymer layer PM3 and is electrically connected to the redistribution layer R2. The redistribution layer R4 penetrates through the polymer layer PM4 and is electrically connected to the redistribution layer R3.

In some embodiments, each of the polymer layers PM1, PM2, PM3 and PM4 includes a photo-sensitive material such as polybenzoxazole (PBO), polyimide (PI), benzocyclobutene (BCB), a combination thereof or the like. In some embodiments, each of the redistribution layers R1, R2, R3 and R4 includes conductive materials. The conductive materials include metal such as copper, aluminum, nickel, titanium, alloys thereof, combinations thereof or the like. In some embodiments, each of the redistribution layers R1, R2, R3 and R4 includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals.

In some embodiments, each of the redistribution layers R1, R1, and R3 includes a plurality of vias V and a plurality of traces T connected to each other. The vias V penetrate through the polymer layers PM1, PM2, PM3 to connect the traces T of the redistribution layers R1, R1, R3, and the traces T are respectively located on the polymer layers PM1, PM2, PM3, and are respectively extending and routing on the top surfaces of the polymer layers PM1, PM2, PM3.

In some embodiments, the topmost redistribution layer R4 is also referred to as under-ball metallurgy (UBM) layer for ball mounting. A plurality of connectors 303 are formed over and electrically connected to the redistribution layer R4 of the RDL structure 302. In some embodiments, the connectors 303 are also referred to as "conductive terminals". In some embodiments, the connectors 303 may be ball grid array (BGA) connectors, solder balls, controlled collapse chip connection (C4) bumps, or a combination thereof. In some embodiments, the material of the connector 303 includes copper, aluminum, lead-free alloys (e.g., gold, tin, silver, aluminum, or copper alloys) or lead alloys (e.g., lead-tin alloys), or combinations thereof. The connector 303 may be formed by a suitable process such as evaporation, plating, ball dropping, screen printing and reflow process, a ball mounting process or a C4 process, or combinations thereof. The connectors 303 are electrically connected to the reconstructed die 500e and the TIVs 300 through the RDL structure 302.

In some embodiments, the package structure PKG1 further includes a dielectric layer 305 disposed on back side of the reconstructed die 500e. The dielectric layer 305 may be a polymer material, such as PI, PBO, BCB, Ajinomoto Buildup Film (ABF), Solder Resist film (SR), or the like. An adhesive layer (e.g. die attach film (DAF)) 304 may be disposed between the reconstructed die 500e and the dielectric layer 305.

A plurality of conductive features 306 may be embedded in the dielectric layer 305 and electrically connected to the TIVs 300. In some embodiments, the package structure PKG1 may further be coupled to other package structure to form a package-on-package (POP) device.

For example, the package structure PKG1 may be electrically connected to a package component 310 to form a POP device PKG2. The package component 310 and the package structure PKG1 may include the same type of devices or the different types of devices. The package component 310 may include active device(s), passive device(s), or combinations thereof. In some embodiments, the package component 310 is a memory device, such as dynamic random access memory (DRAM), static random access memory (SRAM), or other type of memory. In some embodiments, a plurality of package components may be connected to the package structure PKG1, and the plurality of package components may include the same types of devices or the different types of devices.

In some embodiments, the package structure PKG1 is electrically connected to the package component 310 through a plurality of conductive connectors 311. The conductive connectors 311 may be disposed between the conductive features 305 of the package structure PKG1 and the conductive pads 307 of the package component 310 to provide the electrical connection therebetween. The connectors 311 are metallic bumps or balls, such as solder bumps, for example.

An underfill layer 312 may be disposed to fill the space between the package structure PKG1 and the package component 310. The underfill layer 312 laterally wraps around the connectors 311 and may extend to cover sidewall of the package component 310 and/or the sidewall of the package structure PKG1.

In some embodiments, the POP device PKG2 may further be coupled to other package component through the conductive terminals 303. For example, the POP device PKG2 may be electrically coupled to a package substrate 315 through the connectors 303. The package substrate 315 may be a circuit substrate, such as a printed circuit board (PCB).

FIG. 5 illustrates an example of integrating the reconstructed die 500e into a package structure PKG3, which is a CoWoS package structure.

Referring to FIG. 5, in some embodiments, the package structure PKG3 includes a reconstructed die 500e and a semiconductor die 505 electrically bonded to an interposer 410 and further electrically coupled to a package substrate 600 through the interposer 410.

The semiconductor die 505 is disposed laterally aside the reconstructed die 500e and may be coupled to the reconstructed die 500e through the interposer 410. It is noted that, the number of semiconductor die disposed on the interposer shown in FIG. 5 is merely for illustration, and the disclosure is not limited thereto. In some embodiments, more than one semiconductor die may be disposed on the interposer and integrated with the reconstructed die 500e, depending on product design and requirement.

The semiconductor die 505 may be a memory die such as a high bandwidth memory (HBM) die, or a logic die, such as a central processing unit (CPU) die, a graphic processing unit (GPU) die, a micro control unit (MCU) die, an input-output (I/O) die, a baseband (BB) die, or an application processor (AP) die. In some embodiments, the semiconductor die 505 and the dies 10a/10b included in the reconstructed die 500e may be different types of dies or perform different functions. In some embodiments, the semiconductor die 505 include memory stacks, in which multiple electrically connected chips are stacked on top of each other. Generally speaking, the package structure PKG3 may include a wide variety of devices, such as processors, resistors, capacitors, transistors, diodes, fuse devices, memories, discrete electronic devices, power coupling devices or power systems, thermal dissipation devices, combinations thereof, or the like formed therein.

The reconstructed die 500e and the semiconductor die 505 are electrically bonded to the interposer 410 through a plurality of connectors 506 and 507. The interposer 410 may be a semiconductor interposer. In some embodiments, the semiconductor interposer 410 includes a substrate 400, an interconnection structure 401 on the substrate 400, a plurality of through substrate vias (TSVs) 405 and conductive pads 406. The substrate 400 is a semiconductor substrate, such as a silicon substrate. In the embodiments in which the substrate 400 includes silicon, the interposer 400 may also be referred to as a silicon interposer. The interconnection structure 401 includes multiple conductive features embedded in a dielectric structure and interconnected to each other. The interposer 410 may include a plurality of conductive pads or connectors (not shown) disposed on and electrically connected to the top conductive features of the interconnection structure 401. The TSVs 405 are embedded in the substrate 400 and electrically connected to the conductive features of the interconnection structure 401. Dielectric liners (not shown) may be disposed between the TSVs 405 and the substrate 400 to separate the TSVs 405 from the substrate 400. The dielectric liners may include an oxide, such as silicon oxide. The conductive pads 406 are formed on the bottom surface (i.e. back surface) of the substrate 400 and electrically connected to the TSVs 405. In some embodiment, a dielectric layer (not shown) is disposed on back surface of the substrate 400, and the conductive pads 406 penetrate through the dielectric layer to connect the TSVs 405. The conductive pads 406 may be separated from the substrate 400 by the dielectric layer. The dielectric layer may include an inorganic dielectric material such as silicon nitride, or a polymer material. In some embodiments, the semiconductor interposer 410 is free of active devices or passive devices. In alternative embodiments, the semiconductor interposer 410 may include active devices, or passive devices, or combinations thereof.

In some embodiments, the connectors 506 and 507 are respectively disposed between the dies 505 and 500e and the interposer 410 to provide electrical connection. For example, the connectors 507 are disposed between and electrically connected to the connectors 218 of the reconstructed die 500e and the conductive pads (not shown) on the interconnection structure 401 of the interposer 410. The connectors 506 may be disposed between and electrically connected to conductive pads or connectors of the semiconductor die 505 and the conductive pads (not shown) of the interposer 410. The connectors 506 and 507 may include suitable metallic bumps, such as solder bumps.

Underfill layers 508 may be disposed to fill the spaces between the reconstructed die 500e and the interposer 410, and between the semiconductor die 505 and the interposer 401. The underfill layers 508 laterally wrap around the connectors 506 and 507. An encapsulant 510 may be disposed on the interposer 410 to encapsulate the reconstructed die 500e and the semiconductor die 505. In some embodiments, the encapsulant 510 laterally encapsulates the dies 500e and 505, and the top surface of the encapsulant 510 may be substantially coplanar with the top surface of the reconstructed die 500e and the top surface of the semiconductor die 505, but the disclosure is not limited thereto. In alternative embodiments, the encapsulant 510 encapsulates sidewalls and top surfaces of the dies 500e and 505, that is, the top surface of the encapsulant 510 may be higher than the top surface of the reconstructed die 500e and the top surface of the semiconductor die 505.

In some embodiments, the interposer 410 and the dies 500e, 505 bonded thereon may also be referred to as a CoW package, and the CoW package is further coupled to the package substrate 600 to form a CoWoS package structure PKG3. The package structure 600 may be a circuit substrate, such as a printed circuit board (PCB). In some embodiments, the interposer 410 is electrically connected to the package substrate 600 through a plurality of connectors 412. The connectors 412 may be solder balls, controlled collapse chip connection (C4) bumps, or the like . . . . An underfill layer 413 may be disposed to fill the space between the interposer 410 and the package substrate 600. In some embodiments, a plurality of connectors 601 are disposed on the bottom surface of the package substrate 600 for further electrical connection. The connectors 601 may be solder balls, BGA balls, or the like. The connectors 601 are electrically connected to the package substrate 600 and further electrically connected to the interposer 410 and the dies 500e and 505.

In accordance with some embodiments of the disclosure, a semiconductor structure includes a first die, a dielectric layer, a second interconnection structure, a second conductive pad and a conductive feature. The first die includes a first interconnection structure over a first substrate and a first conductive pad disposed on and electrically connected to the first interconnection structure. The first conductive pad has a probe mark on a surface thereof. The dielectric layer laterally warps around the first die. The second interconnection structure is disposed on the first die and the dielectric layer, the second interconnection structure includes a conductive via landing on the first conductive pad of the first die, and the conductive via is spaced apart from the first probe mark. The second conductive pad is disposed on and electrically connected to the second interconnection structure. The conductive feature is disposed on the second conductive pad.

In accordance with alternative embodiments of the disclosure, a semiconductor structure includes a semiconductor support, a plurality of dies, a gap-fill structure, a die-interconnection structure and a connector. The plurality of dies are disposed side by side on the semiconductor support. Each of the plurality of dies includes a semiconductor substrate and an interconnection structure over the semiconductor substrate. The gap-fill structure is disposed on the semiconductor support and laterally aside the plurality of dies. The die-interconnection structure is disposed on the plurality of dies and the gap-fill structure, and the plurality of dies are electrically connected to the each other through the die-interconnection structure. The connector is electrically connected to the plurality of dies through the die-interconnection structure.

In accordance with some embodiments of the disclosure, a method of forming a semiconductor structure includes the following processes: providing at least one die singulated from at least one wafer, wherein the at least one die comprises a first interconnection structure over a first substrate; forming a dielectric layer laterally aside the at least one die; bonding the at least one die and the dielectric layer to a second substrate through a bonding film; forming a second interconnection structure on the at least one die and the dielectric layer; and forming a second conductive pad on and electrically connected to the second interconnection structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a semiconductor structure, comprising:
      a first die, wherein the first die comprises: a first interconnection structure disposed over a first substrate; and a first conductive pad disposed on and electrically connected to the first interconnection structure and embedded by a first passivation layer;
      a dielectric layer, laterally wrapping around the first die, wherein a top surface of the dielectric layer is flush with a top surface of the first passivation layer; and
      a second interconnection structure, disposed on the first die and the dielectric layer, wherein the second interconnection structure comprises a conductive via extending from a conductive line, passing through the first passivation layer and landing on the first conductive pad of the first die, wherein a top surface the conductive via is coplanar with the top surface of the first passivation layer;
   an encapsulant, laterally encapsulating the semiconductor structure; and
   a redistribution layer structure, disposed on the semiconductor structure and the encapsulant.

2. The package structure of claim 1, wherein the first conductive pad has a first probe mark on a surface thereof.

3. The package structure of claim 2, wherein the conductive via is spaced apart from the first probe mark.

4. The package structure of claim 1, wherein the semiconductor structure further comprises:
a connector, disposed on and electrically connected to the second interconnection structure, wherein the connector is embedded by a second passivation layer, and a top surface of the connector is coplanar with a top surface of the second passivation layer.

5. The package structure of claim 4, wherein the second conductive pad has a second probe mark on a surface thereof.

6. The package structure of claim 5, wherein the connector is spaced apart from the second probe mark.

7. The package structure of claim 1, wherein the conductive via has a smooth sidewall.

8. The package structure of claim 1, wherein the semiconductor structure further comprises:
a second die laterally aside the first die and laterally wrapped around by the dielectric layer, wherein the first die and the second die are electrically connected to the each other through the second interconnection structure.

9. The package structure of claim 1, wherein the semiconductor structure further comprises a second substrate disposed below the first die and the dielectric layer, wherein the second substrate is bonded to the first substrate and the dielectric layer through a bonding film.

10. The package structure of claim 1, further comprising:
conductive terminals, disposed on and electrically connected to the redistribution layer structure; and
a package component, disposed below and electrically connected to the redistribution layer structure through multiple through integrated fan-out vias disposed laterally aside the first die.

11. A package structure, comprising:
a semiconductor structure, comprising:
a semiconductor support;
a plurality of dies, disposed side by side on the semiconductor support, wherein each of the dies comprises a semiconductor substrate, an interconnection structure disposed over the semiconductor substrate, and a conductive pad disposed over the interconnection structure and embedded by a first passivation layer;
a gap-fill structure, disposed on the semiconductor support and laterally aside the dies;
a die-interconnection structure, disposed on the dies and the gap-fill structure, wherein the dies are electrically connected to each other through the die-interconnection structure; and
connectors, disposed on and electrically connected to the die-interconnection structure and embedded by a second passivation layer, wherein top surfaces of the connectors are coplanar with a top surface of the second passivation layer;
through vias, disposed around the semiconductor structure; and
a package component, disposed below the semiconductor structure and electrically connected to the semiconductor structure through the through vias.

12. The package structure of claim 11, wherein the die-interconnection structure comprises a first conductive via extending from a conductive line, passing through the first passivation layer and landing on the conductive pad of the corresponding die, wherein a top surface the first conductive via is coplanar with a top surface of the first passivation layer.

13. The package structure of claim 11, wherein the die-interconnection structure further comprises a second conductive via passing through the first passivation layer and landing on a top metal feature of the interconnect structure of the corresponding die.

14. The package structure of claim 11, wherein the semiconductor structure has a substantially vertical sidewall.

15. The package structure of claim 11, further comprising:
a redistribution layer structure, disposed on the semiconductor structure and the through vias; and
conductive terminals, disposed on and electrically connected to the redistribution layer structure.

16. A package structure, comprising:
a semiconductor structure, comprising:
a semiconductor support;
a plurality of dies, disposed side by side on the semiconductor support and electrically insulated from the semiconductor support, wherein each of the dies comprises a semiconductor substrate, an interconnection structure disposed over the semiconductor substrate, and a conductive pad disposed over the interconnection structure and embedded by a first passivation layer;
a gap-fill structure, disposed on the semiconductor support and laterally aside the dies;
a die-interconnection structure, disposed on the dies and the gap-fill structure, wherein the dies are electrically connected to each other through the die-interconnection structure, wherein a sidewall of the die-interconnection structure is vertically coplanar with a sidewall of the semiconductor support; and
connectors, disposed on and electrically connected to the die-interconnection structure and embedded by a second passivation layer, wherein top surfaces of the connectors are coplanar—with a top surface of the second passivation layer; and
a redistribution layer structure, disposed on the semiconductor structure and the gap-fill structure.

17. The package structure of claim 16, wherein the die-interconnection structure comprises a first conductive via passing through the first passivation layer and landing on the conductive pad of the corresponding die.

18. The package structure of claim 16, wherein the dies of the semiconductor structure have different widths.

19. The package structure of claim 16, further comprising:
through vias, disposed around the semiconductor structure; and
a package component, disposed below the semiconductor structure and electrically connected to the semiconductor structure through the through vias.

20. The package structure of claim 19, wherein a sidewall of the package component is recessed from a sidewall of the redistribution layer structure.

* * * * *